United States Patent
Fong et al.

(10) Patent No.: US 9,312,816 B2
(45) Date of Patent: Apr. 12, 2016

(54) FREQUENCY AND PHASE CONVERSION CIRCUIT, WIRELESS COMMUNICATION UNIT, INTEGRATED CIRCUIT AND METHOD THEREFOR

(71) Applicant: MediaTek Singapore Pte. Ltd., Singapore (SG)

(72) Inventors: Neric Fong, Santa Clara, CA (US); Siu-Chuang Ivan Lu, San Jose, CA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/469,564

(22) Filed: Aug. 26, 2014

(65) Prior Publication Data

US 2015/0065194 A1 Mar. 5, 2015

Related U.S. Application Data

(60) Provisional application No. 61/872,952, filed on Sep. 3, 2013.

(51) Int. Cl.
*H04B 1/26* (2006.01)
*H03D 7/14* (2006.01)

(52) U.S. Cl.
CPC ........... *H03D 7/1483* (2013.01); *H03D 7/1458* (2013.01)

(58) Field of Classification Search
CPC ... H03D 7/1458; H03D 7/1483; H04W 88/06
USPC ........... 455/552.1, 86, 75, 60, 263, 323, 326, 455/76; 327/357, 113, 157, 115, 175; 370/252, 329; 375/316, 350, 219, 327
See application file for complete search history.

(56) References Cited

U.S. PATENT DOCUMENTS

| | | | | | |
|---|---|---|---|---|---|
| 4,715,047 | A | * | 12/1987 | Hambley | H04L 27/2332 329/310 |
| 6,108,529 | A | * | 8/2000 | Vice | H03D 7/14 327/113 |
| 6,647,075 | B1 | * | 11/2003 | Genrich | H03C 3/09 375/316 |
| 8,704,582 | B2 | | 4/2014 | Goel | |
| 9,118,276 | B2 | | 8/2015 | Goel | |
| 2001/0048715 | A1 | * | 12/2001 | Lee | H03H 11/22 375/219 |
| 2005/0107063 | A1 | * | 5/2005 | Grewing | H03D 7/165 455/323 |
| 2006/0006986 | A1 | * | 1/2006 | Gravelle | G06K 7/0008 340/10.3 |
| 2006/0131617 | A1 | * | 6/2006 | Nishimuta | H01L 21/823807 257/232 |
| 2006/0229011 | A1 | * | 10/2006 | Naitou | H03D 7/14 455/39 |

(Continued)

*Primary Examiner* — Tan H Trinh
(74) *Attorney, Agent, or Firm* — Winston Hsu; Scott Margo

(57) ABSTRACT

A frequency and phase conversion circuit and wireless communication unit for supporting a plurality of different duty cycles is described. The frequency and phase conversion circuit comprises: a local oscillator module comprising a plurality of frequency conversion modules arranged to receive at least one input clock signal wherein a plurality of phases of the at least one input clock signal are selectable to support a plurality of different duty cycle clock signals; and at least one frequency conversion module comprising a plurality of mixer arrangements configured to receive at least one baseband input signal and the selected plurality of phases of the at least one input clock signal and output a frequency and phase converted representation of the at least one baseband input signal, wherein at least one of the plurality of mixer arrangements is re-used in a plurality of the selectable supportable duty cycles.

22 Claims, 16 Drawing Sheets

(56) References Cited

U.S. PATENT DOCUMENTS

| | | | |
|---|---|---|---|
| 2009/0270062 A1* | 10/2009 | Mu | H03D 7/1441 455/323 |
| 2010/0081408 A1* | 4/2010 | Mu | H03D 7/1441 455/326 |
| 2010/0225386 A1* | 9/2010 | Bax | H04L 27/3818 329/304 |
| 2011/0075581 A1* | 3/2011 | Mihota | H04B 7/0697 370/252 |
| 2011/0121874 A1* | 5/2011 | Kaneko | H03L 7/08 327/157 |
| 2013/0102266 A1* | 4/2013 | Kitsunezuka | H03D 7/1441 455/263 |
| 2014/0235182 A1* | 8/2014 | Milenkovic | H04B 1/0014 455/76 |

* cited by examiner

FREQUENCY AND PHASE CONVERSION CIRCUIT, WIRELESS COMMUNICATION UNIT, INTEGRATED CIRCUIT AND METHOD THEREFOR

CROSS REFERENCE TO RELATED APPLICATIONS

This application claims the benefit of U.S. provisional application 61/872,952, filed on Sep. 3, 2013, which is incorporated by reference in its entirety.

BACKGROUND

The field of this invention relates to a wireless communication unit, a frequency conversion circuit and method for frequency and phase conversion, and in particular to a frequency conversion circuit with a programmable duty cycle.

In telecommunications, there has been a recent trend for device manufacturers to design wireless communication units that are capable of operating over multiple frequency bands, to enable the same device to operate in different geographical regions, as well as being able to switch between different service providers and different communication technologies. The term 'multi-band device' for example, is one that encompasses dual-band, tri-band, quad-band and penta-band devices, and is typically a wireless/mobile phone communication device that supports multiple radio frequency bands. All wireless/mobile phone communication devices that support communications on more than one channel use multiple frequencies. However; a band is a group of frequencies containing many channels. Where the bands are widely separated in frequency, parallel transmit and receive signal path circuits must be provided, which increases the cost, complexity and power demand of multi-band devices.

Hence, in the field of radio frequency (RF) communication units, architectures for supporting communications across multiple and various frequencies have been developed. Typically, a single architecture is able to support multiple frequencies through provision of variable, programmable, duty cycles of the frequency generation signals. For example, 25% duty cycles are common for most cellular transmitters, and architectures providing 33% duty cycles are common for long term evolution (LTE™) communication bands 13 and 26.

Referring to FIG. 1, known examples of a 25% duty cycle architecture 100, and a 33% duty cycle architecture 140, together with a module combining the operation of 25% duty cycle and 33% duty cycle operations 160 are illustrated.

Referring to the 25% duty cycle architecture 100, a series of phase shifted signals are 'mixed' with digital, quadrature-based, baseband signals in order to compensate for varying phase shifts before a resultant RF signal is output at 130. In this case, a baseband signal (BB-0) 102 may have a zero phase shift and, therefore, a local oscillator reference signal (LO-0) with a zero phase shift 104 may be combined or mixed with digital baseband signal 102 to produce a zero phase shift output. Another digital baseband signal (BB-90) 106 has a quadrature phase shift of 90 degrees and, therefore, when mixed with a local oscillator reference signal (LO-270) with a 270 degree phase shift 108 produces a radio frequency signal of a zero phase shift. A similar procedure is carried out for the remaining digital baseband signals BB-180 and BB-270, when mixed with LO-180 and LO-90 in the 25% duty cycle architecture 100.

Referring to the 33% duty cycle architecture 140, a similar operation to that described with relation to the 25% duty cycle architecture 100 is carried out for the 33% duty cycle architecture. However, in this case, there are only three digital baseband signals (BB-0, BB-180 and BB-270) to quadrature frequency convert with corresponding, respective local oscillator reference signal (LO-0, LO-240 and LO-120), due to the increased duty cycle of 33%.

Associated timing diagrams 110 and 150 illustrate the respective phase shifts of the local oscillator reference signals.

It is known that, in some instances, the 25% duty cycle architecture 100 and 33% duty cycle architecture 140 can be combined together to form a further module 160, operable to switch between different duty cycle operations via multiplexer 164, thereby providing a more flexible duty cycle generation module 160 that may support a wider range of frequencies and/or communication standards. In this instance, any of four digital baseband signal (BB-0, BB-90, BB-180, BB-270) 162 may be mixed/combined with any of seven respective local oscillator reference signals 164.

However, as illustrated, in order to achieve this more flexible duty cycle generation module 160, a significant duplication of hardware is required. In the illustrated case, in order to implement a combined 25% and 33% duty cycle operation, seven mixers 162 and a multiplexer 164 are required.

In some examples, it may be beneficial to provide a system that is operable to supply at least two different frequency shifted and phase shifted duty cycle regimes, whilst reducing the number of hardware components required.

SUMMARY

Accordingly, the invention seeks to mitigate, alleviate or eliminate one or more of the above mentioned disadvantages singly or in any combination. Aspects of the invention provide a communication unit and a sliced radio frequency module, as described in the appended claims.

According to a first aspect of the invention, a frequency and phase conversion circuit is described. The frequency and phase conversion circuit comprises: a local oscillator module comprising a plurality of frequency conversion modules arranged to receive an input clock signal and a local oscillator frequency, wherein the input clock signal is adjustable to support a plurality of different duty cycle clock signals, and an arrangement of latches connected in series; wherein at least one of the latches in series is arranged to support a plurality of duty cycles such that the number of latches connected in series is less than the number of duty cycle clock signals supported by the frequency and phase conversion circuit.

According to a second aspect of the invention, a wireless communication unit comprises a frequency and phase conversion circuit. The frequency and phase conversion circuit comprises: a local oscillator module comprising a plurality of frequency conversion modules arranged to receive an input clock signal and a local oscillator frequency, wherein the input clock signal is adjustable to support a plurality of different duty cycle clock signals, and an arrangement of latches connected in series; wherein at least one of the latches in series is arranged to support a plurality of duty cycles such that the number of latches connected in series is less than the number of duty cycle clock signals supported by the frequency and phase conversion circuit.

According to a third aspect of the invention, a method for frequency and phase conversion in a wireless communication unit is described. The method comprises: receiving an input clock signal and a local oscillator frequency, wherein the input clock signal is adjustable to support a plurality of different duty cycle clock signals, supporting a plurality of duty cycles using an arrangement of latches connected in series; and re-using at least one of the latches in series to support the plurality of duty cycles, such that the number of latches connected in series is less than the number of duty cycle clock signals being supported.

According to a fourth aspect of the invention, a programmable phase conversion circuit is described. The programmable phase conversion circuit, comprises: a first input port arranged to receive an input local oscillator signal; a second input port for receiving a clock signal; and a plurality of latches connected in series, such that at least a first latch is arranged to receive the input local oscillator signal that is latched to an output port of the latch by the clock signal; wherein, in a first mode of operation, a plurality of outputs from a number of the latches are combined to produce a first duty cycle, and in a second mode of operation, outputs from a second number of the latches are combined to produce a second duty cycle different to the first duty cycle.

These and other aspects of the invention will be apparent from, and elucidated with reference to, the embodiments described hereinafter.

These and other objectives of the present invention will no doubt become obvious to those of ordinary skill in the art after reading the following detailed description of the preferred embodiment that is illustrated in the various figures and drawings.

DETAILED DESCRIPTION

Examples of the invention will be described in terms of a frequency and phase conversion circuit for a wireless communication unit and, in some examples for a sliced radio frequency module therefor. However, it will be appreciated by a skilled artisan that the inventive concept herein described may be embodied in any type of communication unit that requires frequency and phase conversion. In a number of applications, the adaptation of the communication unit, in accordance with the examples of the invention, may allow for saving in hardware, and therefore cost and die space, as well as current saving.

Some examples of the invention will also be described in terms of using double balanced mixers. However, the concepts herein described are equally applicable to other mixer arrangements/circuits, such as single-ended mixers.

Figure 2:
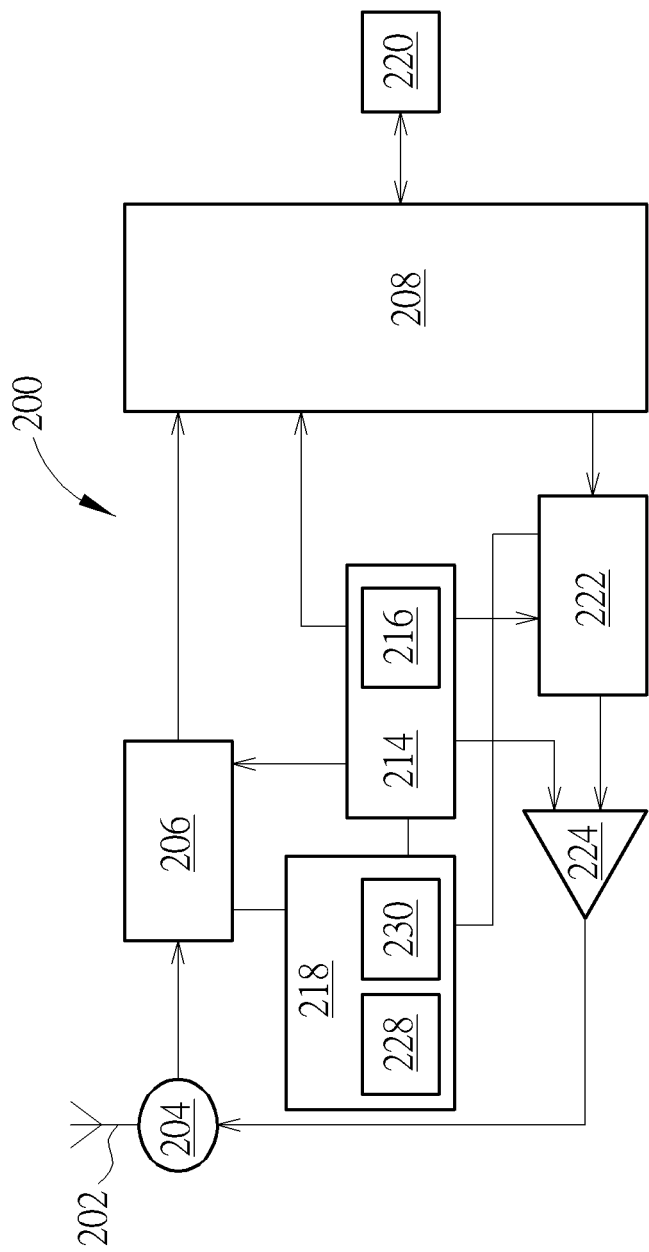
FIG. 2 illustrates an example block diagram of a wireless communication unit, adapted according to aspects of the invention.

Referring first to FIG. 2, a block diagram of a wireless communication unit 200 (sometimes referred to as a mobile subscriber unit (MS) in the context of cellular communications or a user equipment (UE) in terms of a $3^{rd}$ generation partnership project (3GPP™) communication system) is shown, in accordance with a preferred embodiment of the invention. The wireless communication unit 200 comprises an antenna 202 preferably coupled to a duplex filter or antenna switch 204 that provides isolation between receive and transmit chains within the wireless communication unit 200.

The receiver chain includes receiver front-end circuitry 206 (effectively providing reception, filtering and intermediate or base-band frequency conversion). The receiver front-end circuitry 206 is serially coupled to a signal processor 208. An output from the signal processor 208 is provided to a suitable user interface 220, such as a screen or flat panel display. The receiver chain is operably coupled to, or comprises, a controller 214 that maintains overall subscriber unit control. The controller 214 is also coupled to the receiver front-end circuitry 206 and the signal processor 208 (generally realised by a digital signal processor (DSP)). The controller 214 is also coupled to, or comprises, a memory element 216 that selectively stores operating regimes, such as decoding/encoding functions, operating frequencies, synchronisation patterns, code sequences, and the like.

Furthermore, a frequency and phase conversion unit 218 is operably coupled to the controller 214 to control the frequency of signals and clock timing of operations (transmission or reception of time-dependent signals) within the wireless communication unit 200. In this example, the frequency and phase conversion unit 218 comprises at least a local oscillator module 228 arranged to generate and adjust one or more local oscillator signals used in either the transmit chain and/or the receive chain, and a clock/timer module arranged to generate and adjust one or more clock signals used in the wireless communication unit, for example when adjusting a phase of a clock signal to be coupled to local oscillator signal applied in either the transmit chain and/or the receive chain.

As regards the transmit chain, this essentially comprises an input device within user interface 220, such as a keypad, coupled in series through transmitter/modulation circuitry 222 and a power amplifier 224 to the antenna 202. The transmitter/modulation circuitry 222 and the power amplifier 224 are operationally responsive to the controller 214.

The signal processor 208 in the transmit chain may be implemented as distinct from the processor in the receive chain. Alternatively, a single signal processor 208 may be used to implement processing of both transmit and receive signals, as shown in FIG. 2. Clearly, the various components within the wireless communication unit 200 can be realised in discrete or integrated component form, with an ultimate structure therefore being merely an application-specific or design selection.

In some examples, as discussed hereafter, the frequency and phase conversion unit 218 has been adapted to provide a flexible and more efficient duty cycle generation module that is capable of supporting a plurality of duty cycles with a reduced number of hardware components. The frequency and phase conversion unit 218 comprises a local oscillator module comprising a plurality of frequency conversion modules arranged to receive an input clock signal and a local oscillator frequency, wherein the input clock signal is adjustable to support a plurality of different duty cycle clock signals. An arrangement of latches, which in some examples may be in a form of shift registers, is connected in series; wherein at least one of the latches in series is arranged to support a plurality of duty cycles such that the number of latches connected in series is less than the number of duty cycle clock signals supported by the frequency and phase conversion circuit. In this manner, with arranging one or more latches to be able to be re-used across multiple duty cycles, a reduced number of hardware components may be used to support the plurality of duty cycles.

Although examples of the invention are described with respect to supporting a 25% duty cycle architecture and a 33% duty cycle architecture, the concepts herein described are capable of being adapted to support any duty cycle or numbers of duty cycle.

Figure 3:
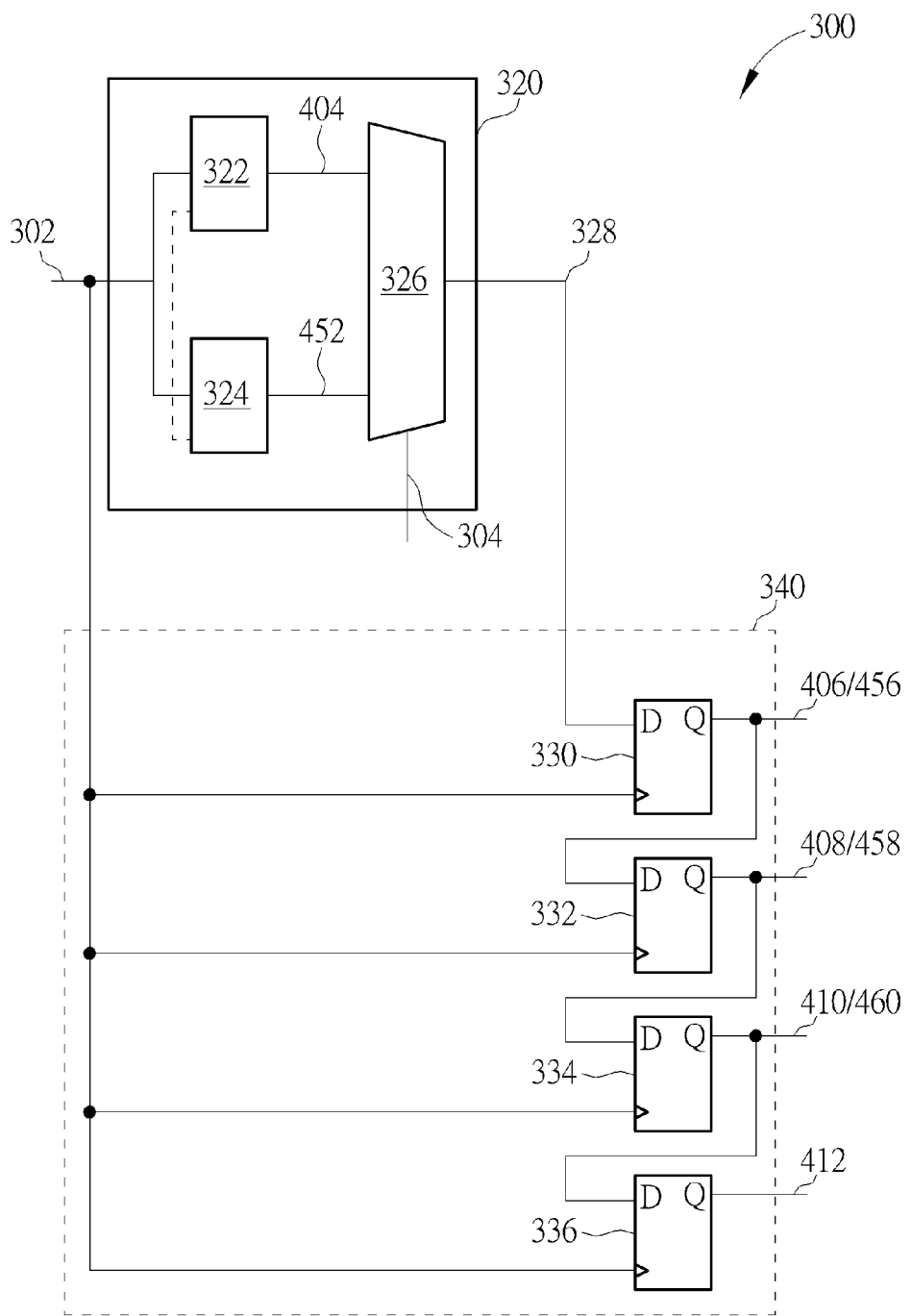
FIG. 3 illustrates an example of a frequency and phase conversion circuit with a programmable duty cycle, according to aspects of the invention.

Referring to FIG. 3, an example of a frequency and phase conversion circuit 300 with a programmable duty cycle, according to aspects of the invention, is illustrated. The frequency and phase conversion circuit 300 comprises a local oscillator (LO) module 320 and a series of latches 330, 332, 334 and 336. In this example, the series of latches are D-type flip flops. However, in other examples, any similar latches that perform a similar function may be utilised.

In this example, LO module 320 comprises a first frequency conversion module 322, a second frequency conversion module 324, having respective local oscillator input ports, to receive a LO mixing signal from frequency generation circuit. In this example, LO module 320 also comprises a selection device 326, for example a multiplexer, arranged to receive the frequency converted signal from each frequency conversion module, which in this example comprises first frequency conversion module 322 and second frequency conversion module 324, and select between. The first frequency conversion module 322, in this example, is a divide-by-4 circuit, and the second frequency conversion module 324 is a divide-by-3 circuit. Both the first frequency conversion module 322 and second frequency conversion module 324 are operably coupled to a clock input 302, which is operable to provide a square wave input to the first and second frequency conversion modules 322, 324. Further, the clock input 302 is operably coupled to each of the plurality of latches 330, 332, 334, 336, wherein the plurality of latches 330, 332, 334, 336 may utilise the clock input 302 for synchronisation purposes.

Figure 4:
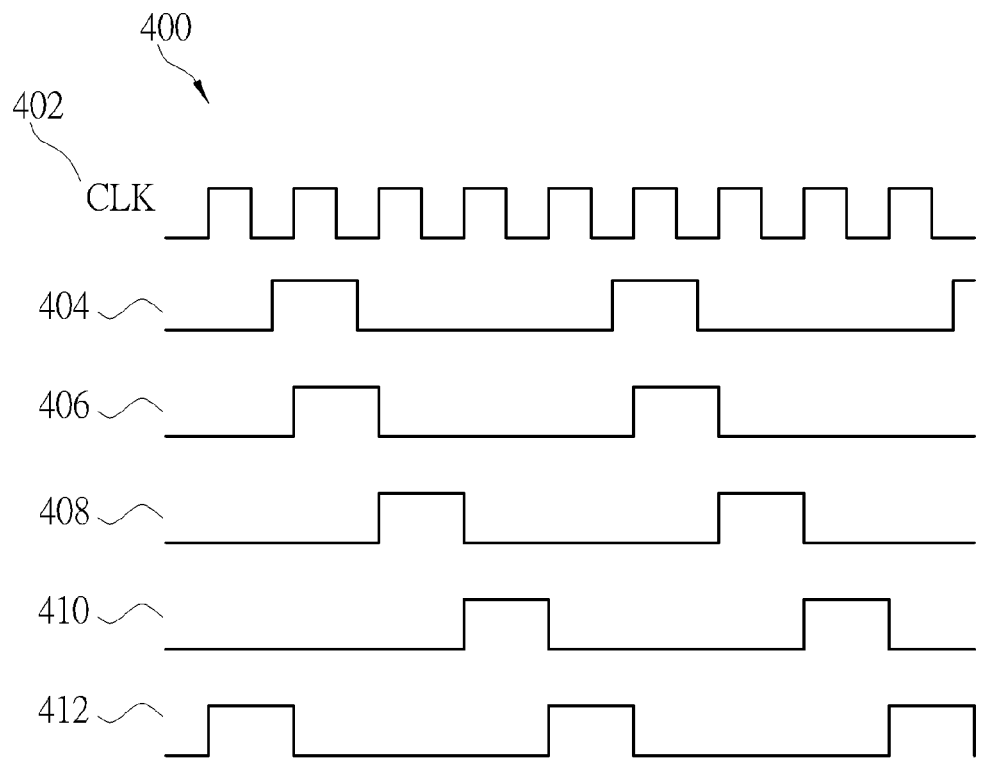
FIG. 4 illustrates example waveforms supported by example embodiments of the invention.
Figure 4:
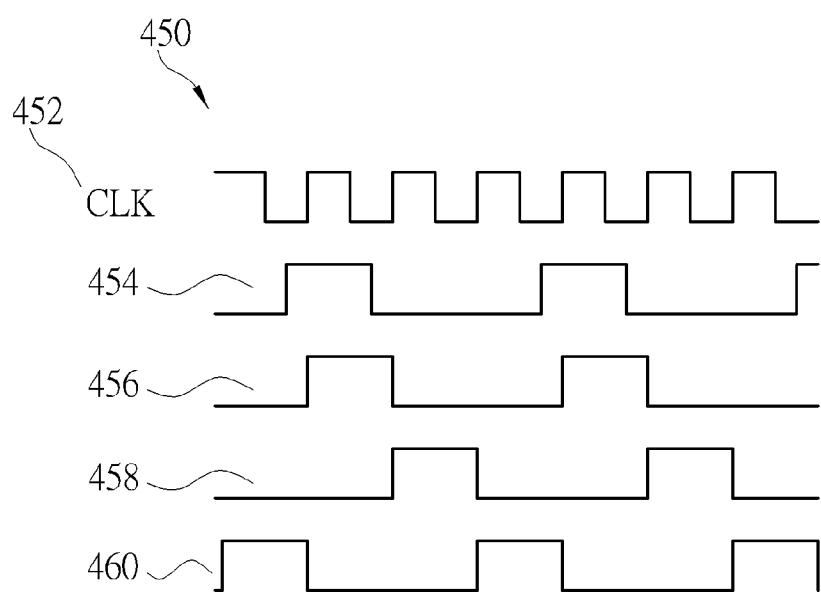

An example operation of the frequency and phase conversion circuit 300 will now be explained with reference to the example timing diagrams of FIG. 4, which illustrates example waveforms generated for a 25% duty cycle regime 400 and example waveforms generated for a 33% duty cycle regime 450.

In this example, the frequency and phase conversion circuit 300 is operable to switch between two duty cycle regimes, namely a 25% duty cycle regime and a 33% duty cycle regime, although in other examples the frequency and phase conversion circuit 300 may be operable to switch between a plurality of different duty cycle regimes, with a 25% duty cycle regime and a 33% duty cycle regime being illustrated for explanatory purposes only.

Referring first to the 25% duty cycle regime, a periodic square wave input clock signal 402 used to generate a 25% duty cycle is operably coupled to clock input 302. The multiplexer 326 operably couples the first frequency conversion module 322 to output 328, via control of a switching signal applied to switching input 304, whilst isolating the second frequency conversion module 324. In some examples, switching input 304 may be set by controller 214 of FIG. 2, which together may form a programmable duty cycle circuit.

A resultant frequency converted signal 404 is output from the first frequency conversion module 322, which is a divide-by-4 representation of the clock signal. The resultant frequency converted signal 404, which may be viewed as a reference signal for subsequent delayed outputs for the 25% duty cycle regime, is output 328 from the multiplexer 326.

The output 328 from multiplexer 326 is input to a phase conversion circuit 340. The phase conversion circuit 340 comprises an arrangement of latches in series; wherein at least one of the series latches is arranged to support a plurality of duty cycles.

In summary, according to some examples relating to a 25% duty cycle, there are four outputs and four sets of signals, where each may have the same duty cycle but with different phases. For example, each latch, 330, 332, 334, 336 may provide a different phase for a similar duty cycle, wherein the number of latches may be defined by the duty cycle, for example 1 latch/duty cycle.

In some examples relating to a 33% duty cycle, only three phases may be generated and, therefore, latch 336 may not be utilised. Therefore, in order to support both examples relating to 25% and 33% duty cycles, only four latches 330, 332, 334, 336 may be required due to the re-use of circuits and components, rather than seven latches/circuits as utilised in the prior art.

Figure 10:
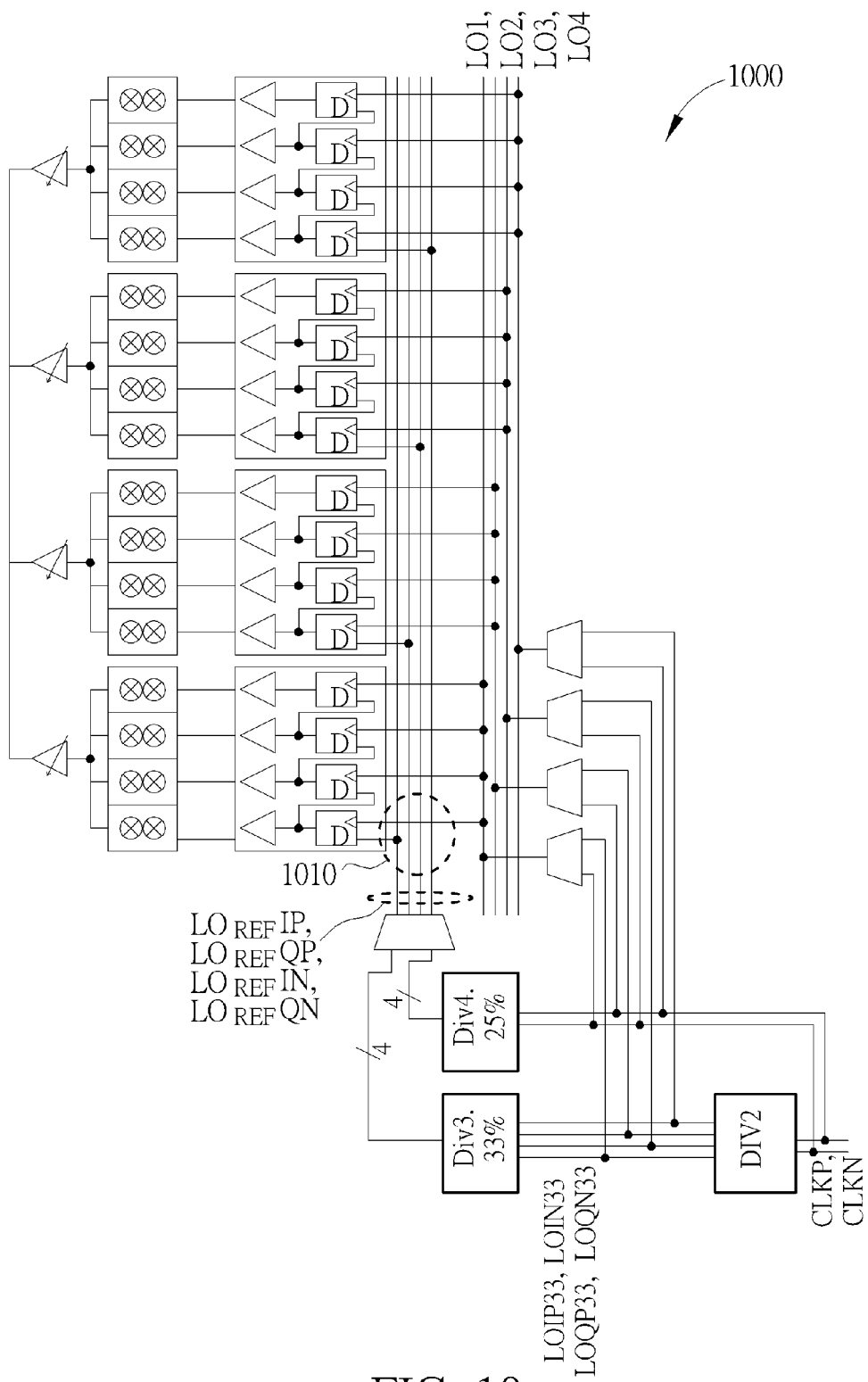
FIG. 10 illustrates a detailed example implementation of a frequency and phase conversion circuit with a programmable duty cycle, utilising single-ended signals, according to aspects of the invention.

It is noteworthy that the generated duty-cycles in FIG. 3 do not take into account quadrature (IQ) rejection. For the 25% duty cycle mode of operation, the phases generated are quadrature and therefore no extra circuit is required to obtain IQ image rejection. However, in some examples, such as in a 33% duty cycle mode of operation with three outputs, additional circuitry for IQ rejection is needed. In some examples, such additional circuitry for IQ rejection can be implemented within FIG. 3 (not shown), or can be implemented in later stages (for example as illustrated in FIG. 10). For the latter case (using the example as illustrated in FIG. 10), there are four outputs instead of three, regardless of 25% or 33% mode, and the outputs are defined as LOREFxx.

In this example, output 328 from multiplexer 326 is input to the first latch 330. The first latch 330 utilises this input signal 404 together with the latching input clock signal 402, to output a resultant signal 406, which is substantially 'in-phase' with the input/reference signal 404. The resultant output signal 406 is subsequently operably coupled to an input of the second latch 332, and may also be utilised as an output to other elements within a system (not shown). The second latch 332 utilises the output signal 406 and the input clock signal 402 to output a phase shifted output signal 408, which, due to the 25% duty cycle regime between the input signal and the original clock signal, is substantially 90 degrees phase shifted relative to the input/reference signal 404.

The resultant output signal 408 is subsequently operably coupled to an input of the third latch 334, and may also be utilised as an output to other elements within a system (not shown). The third latch 334 utilises the output signal 408 and the input clock signal 402 to output a phase shifted output signal 410, which, again due to the 25% duty cycle regime between the input signal and the original clock signal, is substantially a further 90 degrees phase shifted (thereby 180 degrees phase shifted relative to the input/reference signal 404).

The resultant output signal 410 is subsequently operably coupled to an input of the fourth latch 336, and as with other examples, may also be utilised by other elements. The fourth latch 336 utilises the output signal 410 and the input clock signal 402 to output a phase shifted output signal 412, which, again due to the 25% duty cycle regime between the input signal and the original clock signal, is substantially a still further 90 degrees phase shifted (thereby 270 degrees phase shifted relative to the input/reference signal 404).

Therefore, in this example, a 25% frequency converted and phase shifted duty cycle regime can be effected by utilising a clock signal with a 25% duty cycle, and a number of latches 330, 332, 334, 336.

Referring now to the example embodiment when additionally supporting the 33% duty cycle regime, a periodic square wave input clock signal 452 used to generate a 33% duty cycle is operably coupled to clock input 302. Here, the multiplexer 326 operably couples the second frequency conversion module 324 to output 328, via control of a switching signal applied to switching input 304, whilst isolating the first frequency conversion module 322. The output 328 from multiplexer 326 is again input to phase conversion circuit 340.

A resultant frequency converted signal 454 is output from the second frequency conversion module 324, which is a divide-by-3 representation of the clock signal. The resultant frequency converted signal 454, which may be viewed as a reference signal for subsequent delayed outputs for the 33% duty cycle regime, is output from the multiplexer 326, and is operably coupled to the input of the first latch 330. The first latch utilises this input signal 454 together with the latching input clock signal 452, which in this case relates to the 33% duty cycle regime, to output a resultant signal 456, which is substantially 'in-phase' with the input/reference signal 454. The resultant output signal 456 is subsequently operably coupled to the input of the second latch 332, and may also be utilised as an output to other elements within a system (not shown). The second latch 332 utilises the output signal 456 and the input clock signal 452 to output a phase shifted output signal 458, which, due to the 33% duty cycle regime between the input signal and the original clock signal, is substantially 120 degrees phase shifted relative to the input/reference signal 454.

The resultant output signal 458 is subsequently operably coupled to an input of the third latch 334, and may also be utilised as an output to other elements within a system (not shown). The third latch 334 utilises the output signal 458 and the input clock signal 452 to output a phase shifted output signal 460, which, again due to the 33% duty cycle regime between the input signal and the original clock signal, is substantially a further 120 degrees phase shifted (thereby 240 degrees phase shifted relative to the input/reference signal 452).

In this example, only three latches 330, 332 and 334 are required to provide suitably frequency and phase converted signals for the 33% duty cycle regime and, therefore, fourth latch 335 is not utilised for the 33% duty cycle regime.

Figure 5:
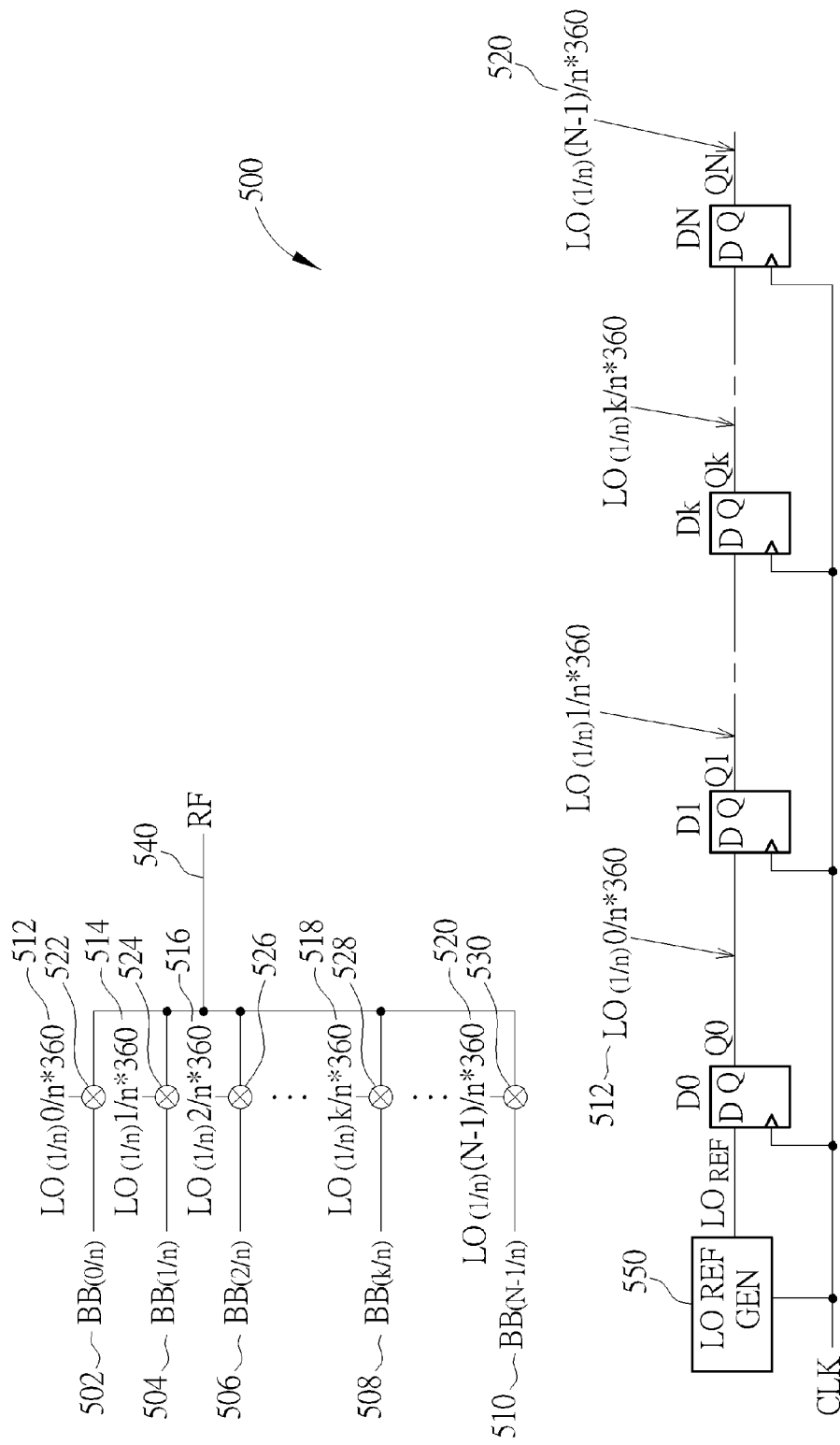
FIG. 5 illustrates an example of a generic frequency and phase conversion circuit with a programmable duty cycle, according to aspects of the invention.

Referring to FIG. 5, an example of a generic frequency and phase conversion circuit 500 with a programmable duty cycle, according to aspects of the invention, is illustrated. The frequency and phase conversion circuit 500 is a generic representation of the specific frequency and phase conversion circuit 300 of FIG. 3. The frequency and phase conversion circuit 500 comprises a local oscillator (LO) module 550 and a series of latches. In this example, the series of latches are D-type flip flops. However, in other examples, any similar latches or shift registers that perform a similar function may be utilised.

In this example, the number of latches required to output the required phase shifted waveforms based on a particular duty cycle is dependent on the inverse of the required duty cycle, i.e. 1/N where N is an integer. In some examples, the frequency conversion architecture can be programmable for a 1/n duty cycle, where n is an integer from {1 . . . N}, where 1/N is the minimum duty cycle required for the system. During a 1/n duty cycle, '1/n' mixer elements 522-530 and n LO phases 512-520 are enabled. Baseband inputs 502-510 are input to the 'n' mixer elements 522-530. If 1/N is the minimum duty cycle, this architecture requires a maximum of 'N' mixer elements for mixing, driven by a maximum of 'N' LO phases, where 'n' LO phases are generated using shift registers and n is any integer from {1 . . . N}. Again, in some examples, switching inputs (not shown) and enabling of devices may be set by controller 214 of FIG. 2, to form a programmable duty cycle circuit. In some examples of the invention herein described, the plurality 'n' of mixer elements may be illustrated as double balanced mixers.

As illustrated, there are $BB_{n-1}$: arbitrary baseband inputs, where N is the inverse of the minimum duty cycle required by the system, and thus where 1/N is the minimum duty cycle required.

For example, in the case of a 25% duty cycle, i.e. ¼, N would equate to four. Therefore, four latches would be required to generate the required frequency and phase shifts for the 25% duty cycle regime. Further, in the case of a 33% duty cycle, i.e. ⅓, N would equate to 3. Therefore, three latches would be required to generate the required frequency and phase shifts for the 33% duty cycle regime. Therefore, as discussed above, the fourth latch 336 would not be required in the 33% duty cycle regime.

An advantage of this example is that only four devices/latches are required to generate the required phase and frequency shifted duty cycles to support both 25% and 33% regimes, as compared to the prior art example where seven devices were required to perform the same functionality.

Therefore, by utilising aspects of this invention, the amount of hardware required to implement a multiple duty cycle device, for example the frequency and phase conversion circuit with a programmable duty cycle 300 illustrated in FIG. 3, can be reduced.

It is noteworthy that the 25% and 33% regime example illustrated in FIG. 3 should not be considered as a limiting example, but is shown purely as an illustrative example. As such other implementations, latch arrangements, switching arrangements and supported duty cycles can be provided in other examples. For example, other example embodiments may incorporate more than two frequency conversion modules, for example for supporting a range of selectable duty cycles across three frequency bands.

Further, other examples are not limited to utilising divide-by-4 and divide-by-3 circuits for 25% and 33% duty cycles respectively. It is envisaged that in some examples, a range of duty cycles and divide-by-2N circuits, where N is a positive integer except zero, may be utilised.

It should also be noted that the number of latches to be implemented in the frequency and phase conversion circuit with a programmable duty cycle 300 is partly dependent on the duty cycles utilised. For example, in the above mentioned example, implementation of a frequency and phase conversion circuit with a programmable duty cycle 300 configured to support both 25% and 33% duty cycles, a duty cycle of 25%, requires a minimum duty cycle (N) of N=4, and in this example requires four latches, and a duty cycle of 33%, requires a minimum duty cycle N=3, requiring 3 latches.

Figure 1:
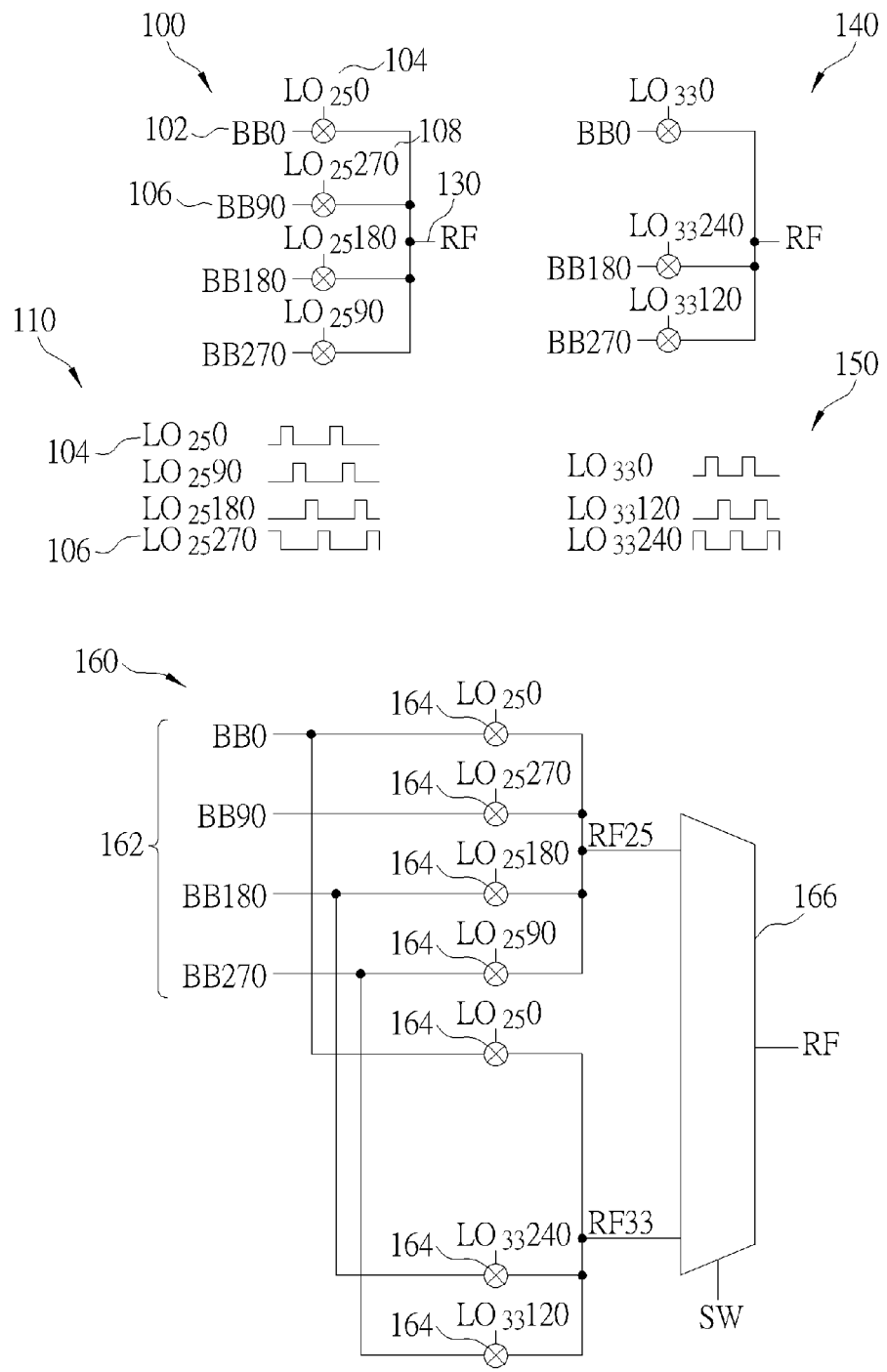
FIG. 1 illustrates known architectures to support duty cycle regimes.

In some other examples, duty cycles of, for example, 10% and 20% may be implemented, wherein a duty cycle of 10%, N=10, may require ten latches, and a duty cycle of 20%, N=5, may require five latches. Therefore, utilising aspects of the invention, only ten latches would be required to implement a frequency and phase conversion circuit with a programmable duty cycle, whereas referring to the prior art technique illustrated in FIG. 1, the known implementation would require a combination of 15 devices to implement the same functionality. Therefore, utilising aspects of the invention, hardware savings can be made.

In some examples, a sequence of latches in series utilised in aspects of the invention may be denoted as an array of shift registers.

Figure 6:
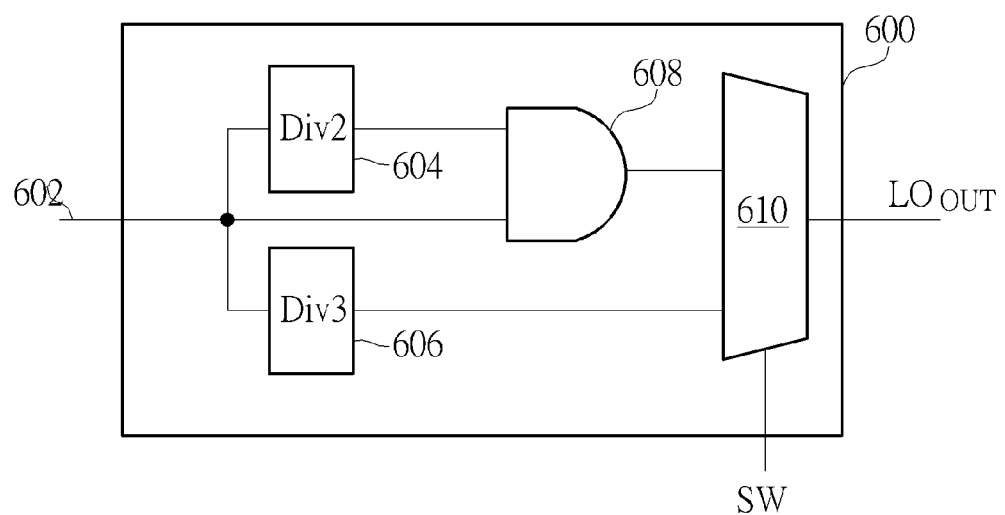
FIG. 6 illustrates an alternative example of a local oscillator module supported by example embodiments of the invention.

Referring to FIG. 6, an alternative example of a local oscillator module 600 is illustrated, for example as could replace the local oscillator module 320 from FIG. 3. In this example, the local oscillator module 600 comprises, a clock signal 602, a divide-by-2 circuit 604, a divide-by-3 circuit 606 (which equates to second frequency conversion module 324 of FIG. 3), logic AND gate 608 and switchable multiplexer 610. In this example, the operation of local oscillator module 600 is similar to the operation of local oscillator module 320 from FIG. 3. However, in this example, the divide-by-2 circuit 604, in combination with the logic AND gate 608 (which equates to first frequency conversion module 322 of FIG. 3), is able to provide a 25% duty cycle at LO out, with the logic AND gate 608 effectively working with the divide-by-2 circuit 604 to create a divide-by-four operation. Thus, the combination of the divide-by-2 circuit 604 with the logic AND gate 608 is able to provide a divide-by-four output signal if selectively enabled by switchable multiplexer 610. In the same manner as FIG. 3, divide-by-3 circuit 606 is able to provide a 33% duty cycle at the LO output, if selectively enabled by the SW control signal applied to switchable multiplexer 610.

Figure 7:
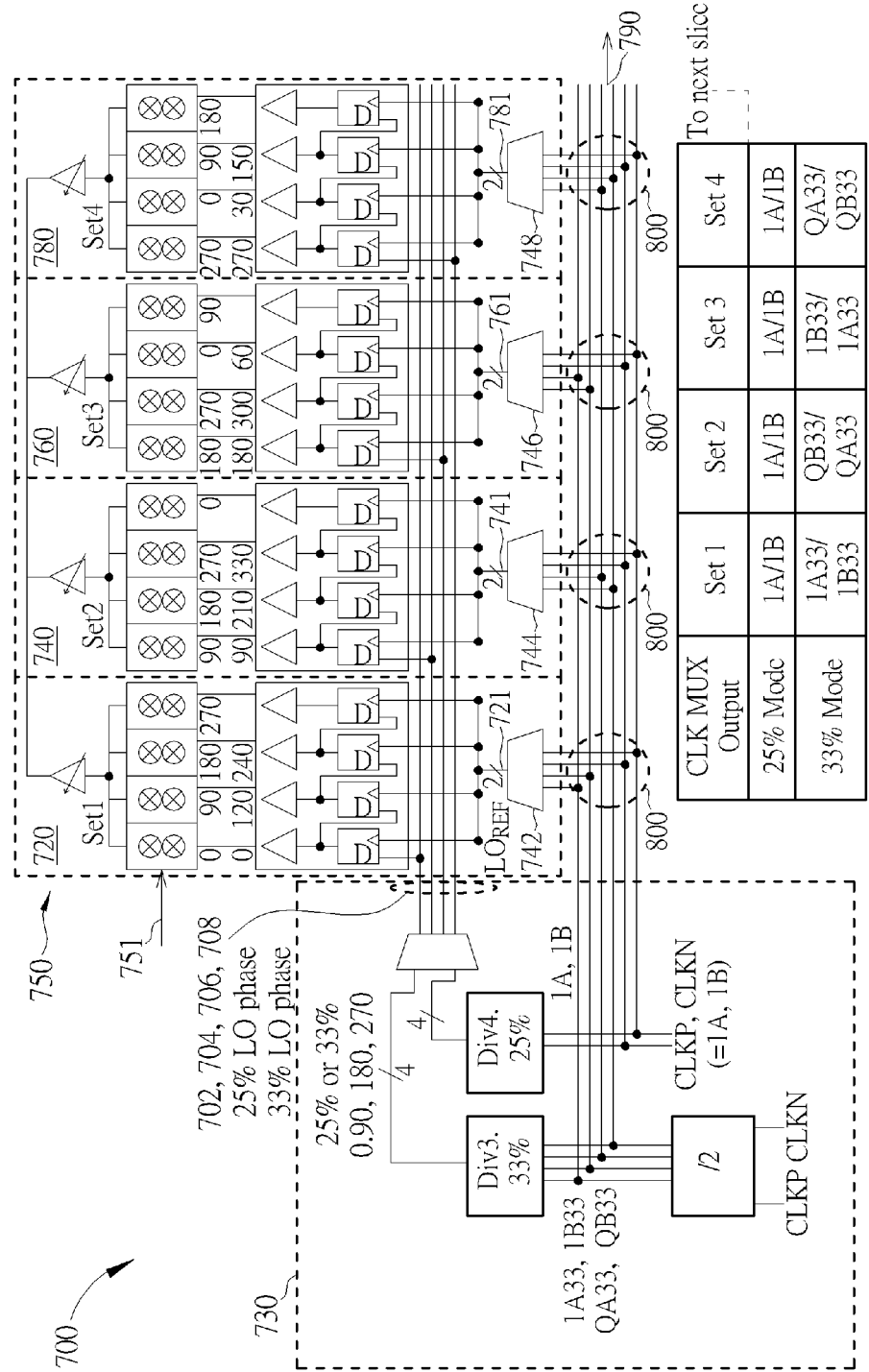
FIG. 7 illustrates a detailed example implementation of a frequency and phase conversion circuit with a programmable duty cycle, utilising differential signals, according to aspects of the invention.

Referring to FIG. 7, a detailed example block diagram 700 of a frequency and phase conversion circuit with a programmable duty cycle is illustrated. In this example, as illustrated later in FIG. 14 and FIG. 15, the circuitry 750 may be implemented on each of a plurality of slices, with the same frequency and phase converted set of signals generated by local oscillator block 730 also being passed onto other slices (not shown).

In this example, the slice 750 may comprise four driver/synchroniser modules 720, 740, 760, and 780, wherein the number of modules may be dependent on the required duty cycles to be implemented by the system, as discussed previously. Synchronization is achieved by a number of flip flops located in each of four driver/synchroniser modules 720, 740, 760 and 780. In this example, each of the four driver/synchroniser modules 720, 740, 760 and 780 also receives baseband inputs 751.

Further, each of the four driver/synchroniser modules 720, 740, 760 and 780 may be driven by different local oscillator signals, LOref, 702, 704, 706, 708, which may be determined by outputs, say from the local oscillator block 730. Again, in some examples, one or more switching inputs (not shown) may enable devices and/or signal paths and may be set by controller 214 of FIG. 2, to form a programmable duty cycle circuit. For example, first driver/synchroniser module 720 may receive a first local oscillator reference signal 721 being driven differentially, second driver/synchroniser module 740 may receive a second different local oscillator reference signal 741 being driven differentially, third driver/synchroniser module 760 may receive a third different local oscillator signal 761 being driven differentially, and fourth driver/synchroniser module 781 may receive a fourth different local oscillator signal 781 also being driven differentially.

In this example, driver/synchroniser block 720 may be operable to receive first local oscillator reference signal 721 via multiplexer 742, which may be a phase shifted output from the frequency and phase conversion circuit, for example with programmable duty cycle as disclosed in FIG. 3. Similarly, further, driver/synchroniser block 740 may be operable to receive a second local oscillator reference signal 741 via multiplexer 744, which may be a phase shifted output from the frequency and phase conversion circuit. Furthermore, driver/synchroniser block 760 may be operable to receive a third local oscillator reference signal 761 via multiplexer 746, which may be a phase shifted output from the frequency and phase conversion circuit. Finally, in this example, the driver/synchroniser block 780 may be operable to receive a fourth local oscillator reference signal 781 via multiplexer 748, which may be a phase shifted output from the frequency and phase conversion circuit.

In FIG. 7, the multiplexers 742, 744, 746, 748 of the driver/synchroniser blocks 720, 740, 760, 780 each receive four further inputs from local oscillator block 730 via a series of multiplexer circuits/arrangements 800, as described in Table 1.

Thus, as illustrated, each of the local oscillator reference signals may be independently phase adjusted and multiplexed within the set.

Thus, in FIG. 7, each of four driver/synchroniser modules 720, 740, 760 and 780 comprises a series of mixers receiving a baseband input signal 751 and a local oscillator input that is notably a function of both LO1-4 and LOrefs, 702, 704, 706, 708. In this example, the plurality 'n' of mixer elements are illustrated as double balanced mixers, i.e. four double balanced mixers (comprising eight mixer elements) for each of four driver/synchroniser modules 720, 740, 760 and 780. Thus, to support a 33% duty cycle mode, a minimum of three LO phases require supporting in the mixing stage: 0°, 120° and 240°, across the four driver/synchroniser modules 720, 740, 760 and 780. To improve radio frequency performance of the circuit of FIG. 7, the number of mixer stages that are used is first doubled to support differential signals, and further doubled to support quadrature signals. Hence, twelve mixers may be used. In order to support a 25% duty cycle mode, a minimum of four LO phases require supporting in the mixing stage 0°, 90°, 180° and 270°. As the 25% duty cycle mode is quadrature and differential in nature, it does not require the four times mixer elements per driver/synchroniser modules 720, 740, 760 and 780. However, in this example and in one hardware-sharing implementation making a 25% duty cycle mode compatible with a 33% duty cycle mode, four double balanced mixers (i.e. eight mixer elements) may be employed per driver/synchroniser modules 720, 740, 760 and 780. Hence, in this example, a total of sixteen double balanced mixers (comprising thirty two mixer elements) as illustrated in the example of FIG. 7.

In some examples, the baseband input signal 751 may be considered as four inputs, for example I+, I−, Q+, Q−.

In this example, four driver/synchroniser blocks 720, 740, 760, 780 are required to support implementation of a 33% duty cycle, and only two driver synchroniser blocks are required to support implementation of a 25% duty cycle. However, for compatibility, during a 25% duty cycle operation, some of the driver/synchroniser blocks may be paired together.

Figure 11:
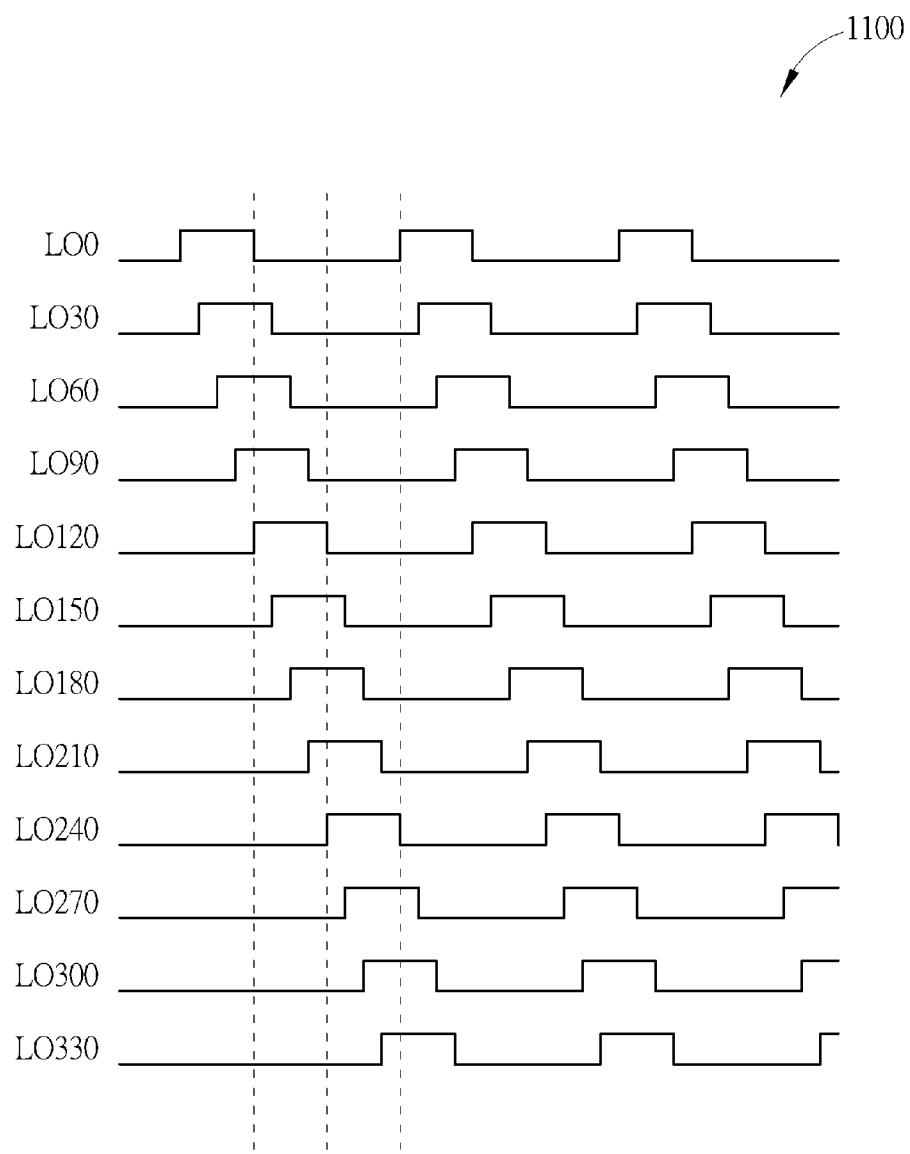
FIG. 11 illustrates examples of 33% duty cycle waveforms.

Referring first to a 33% duty cycle operation, first driver/synchroniser block 720 may be operable to receive 0°, 120°, and 240° phase shifted signals from multiplexer 742 of the local oscillator block 730. Further, second driver/synchroniser block 740 may be operable to receive 90°, 210° and 330° phase shifted signals from multiplexer 744 of the local oscillator block 730. Furthermore, driver/synchroniser block 760 may be operable to receive 180°, 300° and 60° phase shifted signals from multiplexer 746 of the local oscillator block 730, and driver/synchroniser block 780 may be operable to receive 270°, 30° and 150° phase shifted signals from multiplexer 748 of the local oscillator block 730. In this manner, all twelve options for phase shifting signals in 30° increments can be supported using the four driver/synchroniser blocks 720, 740, 760, 780. The twelve phase shifted signals 1100 corresponding to the example 33% duty cycle waveform are illustrated in FIG. 11. Further, in the 33% duty cycle operation, and particularly noting that this example supports differential signal operation with a provision of two driver/synchroniser blocks, and supports quadrature signals for I-Q image rejection, only twelve out of the total sixteen flip flops are enabled. Thus, in this example, and referring to Table 1 below, four local oscillator reference signals (LOREFxx) can be used to generate the twelve LOx signals with four sets of different 33% duty cycle clock signals, with 30°. separation between the different sets. In FIG. 7, the generation of twelve LOx signals is achieved using twelve out of the sixteen double balanced mixers shown. In some examples, in order to support IQ rejection, two mixer stages (such as an I-path mixer and Q-path mixer) per driver/synchroniser block may be dedicated for this purpose.

Referring to a 25% duty cycle operation, driver/synchroniser blocks 720, 740 may be operable to receive 0° and 180° phase shifted signals from multiplexers 742 and 744 of the local oscillator block 730, and driver/synchroniser blocks 760, 780 may be operable to receive 90° and 270° phase shifted signals from multiplexers 746 and 748 of the local oscillator block 730.

As discussed above, as only two phase shifts are required for the 25% duty cycle operation, and therefore the four driver/synchroniser blocks 720, 740 and 760, 780 may be paired together.

In this example, the 33% duty cycle operation requires more phases than the 25% duty cycle operation, which is due to the IQ signals being inherently 90 degrees to each other, thereby generating coinciding phases. Further, in the 25% duty cycle operation, all sixteen flip flops are enabled.

Table 1 below illustrates an example for generating the phase from 0 deg. to 330 deg. for a 33% duty cycle using LOx and LOREFxx:

TABLE 1

| Set | $LO_{REF}$ | DFF0 | DFF1 | DFF2 |
|---|---|---|---|---|
| 1 | $LO_{REF}$IP (LO0) | LO0 | LO120 | LO240 |
| 2 | $LO_{REF}$QP (LO90) | LO90 | LO210 | LO330 |
| 3 | $LO_{REF}$IN (LO180) | LO180 | LO300 | LO60 |
| 4 | $LO_{REF}$IN (LO270) | LO270 | LO30 | LO150 |

Figure 8:
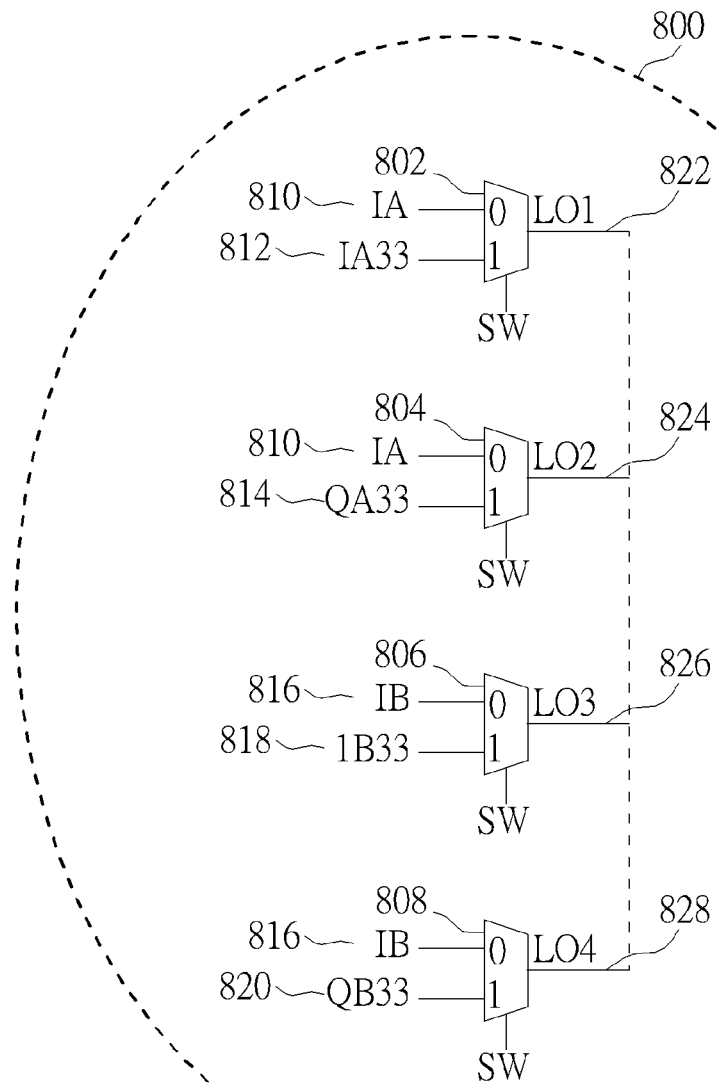
FIG. 8 illustrates an example of a multiplexer network utilised in FIG. 7.

Referring to FIG. 8, one example of multiplexer circuit/arrangement 800 is illustrated. In this example, a number of multiplexers 802, 804, 806, 808 may be arranged to receive (when supporting a 25% duty cycle and 33% duty cycle) a total of six long and noise-sensitive clock lines, namely IA 810, and IB 816 for the 25% duty cycle and IA33 812, QA33 814, IB33 818 and QB33 820 for the 33% duty cycle. The multiplexers 802, 804, 806, 808 output a total of four outputs 822, 824, 826, 828, to reduce the LO lines from six to four, which is the maximum number of outputs required to support a 25% duty cycle and 33% duty cycle. In some examples, the total of four outputs 822, 824, 826, 828 may represent local oscillator signals LO1, LO2, LO3, LO4, wherein these local oscillator signals may be output by multiplexers 802, 804, 806, 808 to inputs of multiplexers as shown in FIG. 10. In one example embodiment, as illustrated, the LO outputs 822, 824, 826, 828 may be combined.

Figure 9:
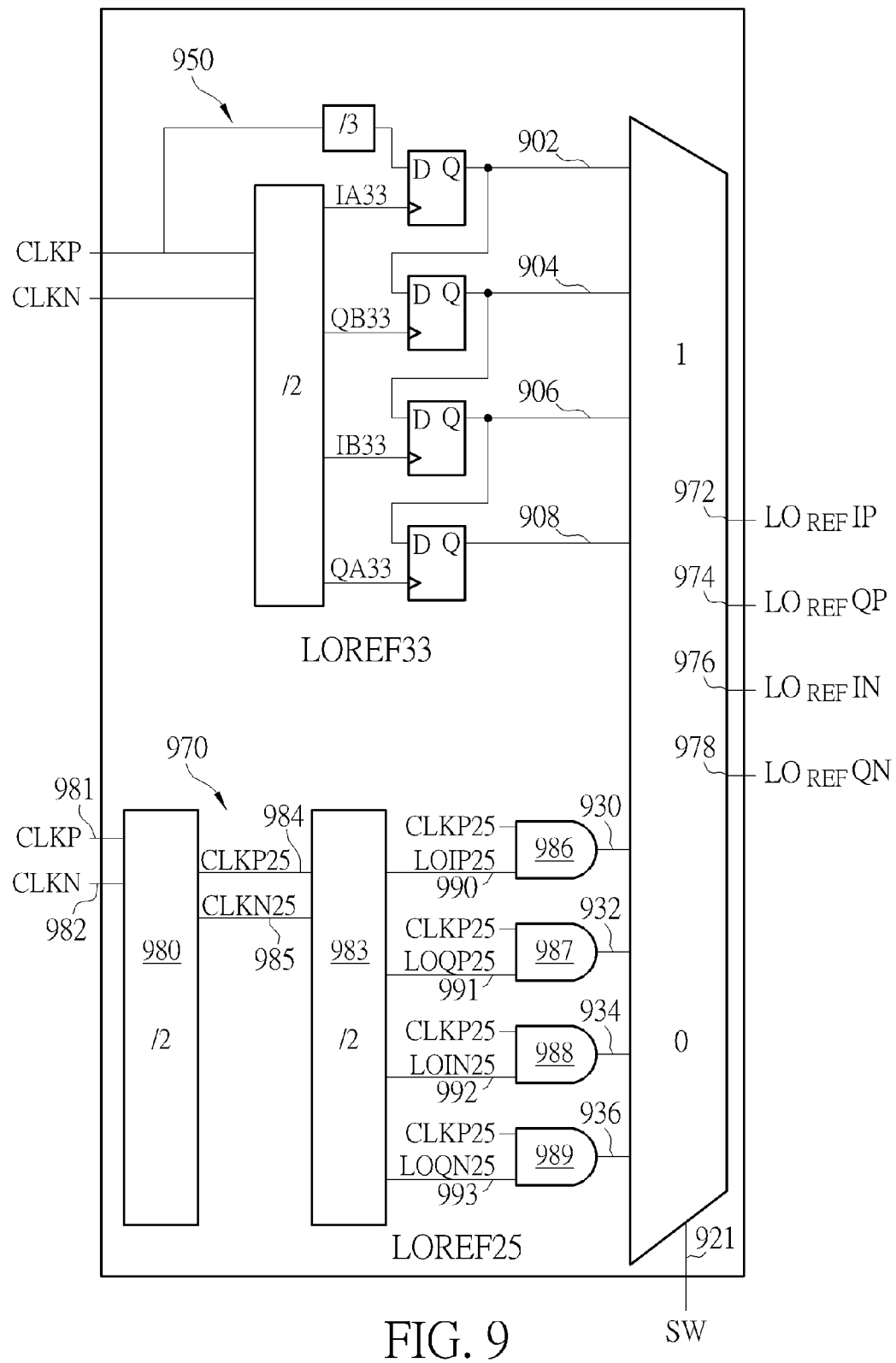
FIG. 9 illustrates an example block diagram of the local oscillator block from FIG. 7, according to aspects of the invention.

Referring to FIG. 9, an example block diagram of a local oscillator block is illustrated. In this example, the separate multiplexers to generate the clocks LO1-LO4 have been removed. In this example, the local oscillator block may comprise logic circuit 950, for example forming part of the frequency and phase conversion circuit with programmable duty cycle 300 from FIG. 3. Logic circuit 950 is illustrated in a form of a divide-by-two circuit and a divide-by-three circuit followed by a series of D-type flip flops. In this manner, the logic circuit 950 may be configured to provide 25% duty cycle local oscillator reference signals 902, 904, 906, 908 to the multiplexer 920 in order to support a 33% duty cycle.

In this example, the further logic 970 may comprise a first divide-by-two circuit 980 operable to receive master clock inputs 981 and 982, and a second divide-by-two circuit 983, operable to receive modified output signals 984, 985 from the first divide-by-two circuit. A series of logic AND gates 986, 987, 988, 989 may be operable to receive local oscillator output signals 990, 991, 992, 993 from the second divide-by-two circuit 983 and combine these with a further received signal. In this manner, the further logic circuit 970 may be configured to provide 25% duty cycle local oscillator reference signals 930, 932, 934, 936 to the multiplexer 920.

Figure 12:
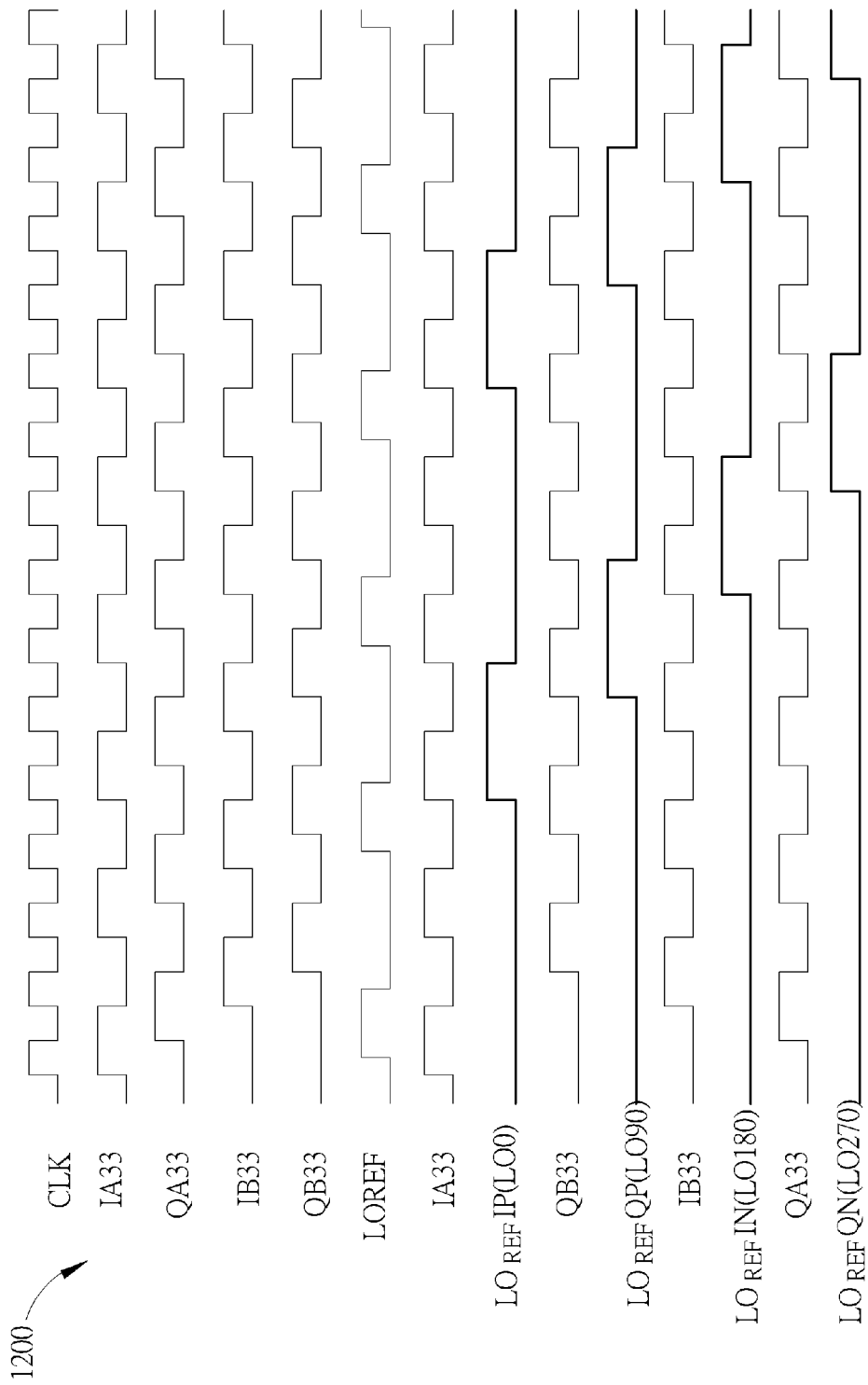
FIG. 12 illustrates examples of LOREFx waveforms.

Therefore, in this example, two separate logic circuits may be used and combined by multiplexer 920 to independently provide either 33% duty cycle local oscillator reference signals 902, 904, 906, 908 or 25% duty cycle local oscillator reference signals 930, 932, 934, 936. In this example, the multiplexer 920 may be operable to select between outputting received 33% duty cycle local oscillator signals or 25% duty cycle local oscillator signals via a switch control signal 921. The chosen selected signals may be output by the multiplexer 920 as LOREF signals 972, 974, 976, 978. An example of these waveforms 1200 is illustrated in FIG. 12.

In some examples, the second divide-by-two circuit 983 may output four different clock signals LOIP25 990, LOQP25 991, LOIN25 992 and LOQN25 989. In this example, only two types of clock waveform (CLKP 981 and CLKN 982) are needed in order to generate the various (25% and 33% duty cycle) waveforms.

In some other examples, the number of outputs of the part of the frequency conversion device 950 may be inversely proportional to the lowest duty cycle required to be supported by the local oscillator block, for example a 12.5% duty cycle would require eight latches and a minimum of eight outputs.

Referring first to the local oscillator block's operation for a 25% duty cycle, the switching signal 921 may select a particular duty cycle by applying a control signal of logical '0' to outputs 902, 904, 906, 908. In this example, the operation of multiplexer 920 may be controlled in order to output local oscillator reference signals $LO_{REF}IP$ 972, $LO_{REF}QP$ 974, $LO_{REF}IN$ 9763, $LO_{REF}QN$ 978 for a 25% duty cycle.

Referring to the local oscillator block's operation for a 33% duty cycle, the switching signal 921 may set a particular duty cycle by controlling the series of selection devices via applying a control signal of logical '1' to 902, 904, 906, 908. Therefore, multiplexer 920 may be controlled to output local oscillator reference signals $LO_{REF}IP$ 972, $LO_{REF}QP$ 974, $LO_{REF}IN$ 9763, $LO_{REF}QN$ 978 for a 33% duty cycle.

Again, it is noteworthy in this example that the use of 25% and 33% duty cycles is merely for explanatory purposes, and elements within the example embodiments can be modified to implement other required duty cycles. For example, if a 10% duty cycle were to be implemented, the part of the frequency conversion device 950 may be implemented with ten outputs, and the series of selection devices may comprise, for example, ten multiplexer devices. Further, as discussed previously, the frequency and phase conversion circuit with programmable duty cycle 950 may be modified to accommodate a 10% duty cycle by, for example, incorporating a divide-by-10 circuit and up to ten latches in series.

For clarity purposes, connections between some components within local oscillator block have not been shown.

Referring to FIG. 10, a further detailed example block diagram 1000 of a frequency and phase conversion circuit with a programmable duty cycle is illustrated. This example block diagram 1000 is similar in many aspects to the implementation of example block diagram 800 of FIG. 8, albeit with the number of LO lines being reduced from six to four using the multiplexers 802, 804, 806, 808 in FIG. 8 and where the clock signal is driven by single-ended signals 1010. Hence, in this example, each of the four driver/synchroniser modules 1020, 1040, 1060, and 1080 do not include their individual multiplexers (such as multiplexers 802, 804, 806, 808 from FIG. 8) and the clocks of the 'D' type flip flops are driven using the same single-ended clock signal. Again, the circuitry 1000 may be implemented on each of a plurality of slices, with the same frequency and phase converted set of signals generated by local oscillator block also being passed onto other slices (not shown).

Figure 13:
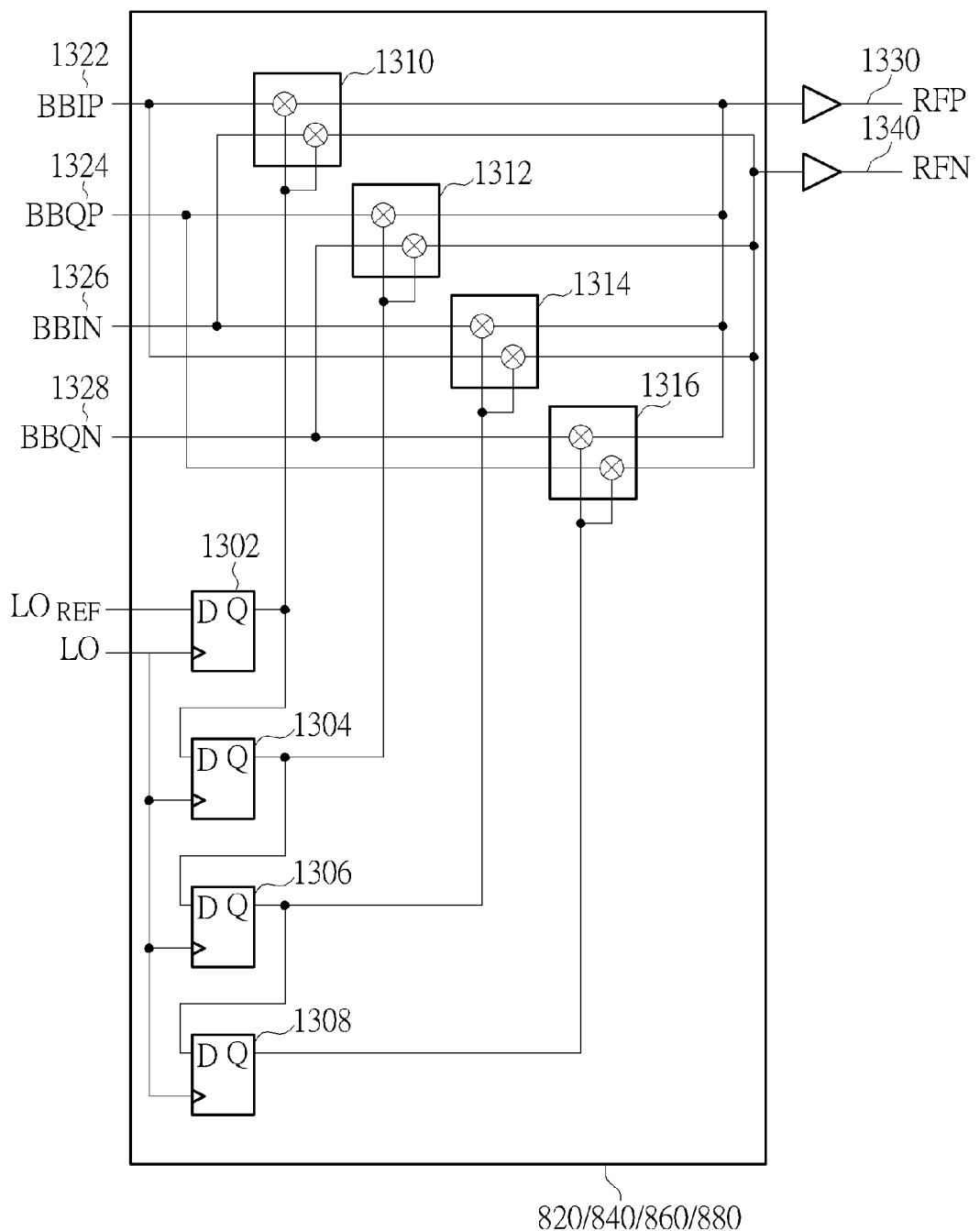
FIG. 13 illustrates a more detailed block diagram of one of the transmit driver/synchroniser blocks from FIG. 8.

Referring now to FIG. 13, a more detailed block diagram of one of the transmit driver/synchroniser blocks 820, 840, 860, 880 of FIG. 8 has been illustrated, comprising a series of latches 1302, 1304, 1306 and 1308, which may collectively form a shift register device, and a series of mixer blocks 1310, 1312, 1314, 1316, operably coupled to baseband inputs BBIP 1322, BBQP 1324, BBIN 1326 and BBQN 1328. In this example, differential signals, are enabled, with the 'P' and 'N' suffixes referencing plus and minus parts of the differential signals.

In this example, four latches 1302, 1304, 1306 and 1308 have been utilised, in order to accommodate a 25% and 33% duty cycle, as discussed previously. Further, as discussed previously, the series of latches 1302, 1304, 1306 and 1308, depending on the input signals received by $LO_{REF}$ 1312 and LO 1314 from the local oscillator block 630, will provide phase shifted outputs to the series of mixer blocks 1310, 1312, 1314 and 1316.

In this example, the series of latches 1302, 1304, 1306 and 1308 provide phase shifted signals with either a 25% or 33% duty cycle to corresponding mixer blocks 1310, 1312, 1314 and 1316, wherein the mixer blocks multiply the phase shifted signals with respective baseband signals 1322, 1324, 1326 and 1328 to provide output RF signals RFP 1330 and RFN 1340.

Figure 14:
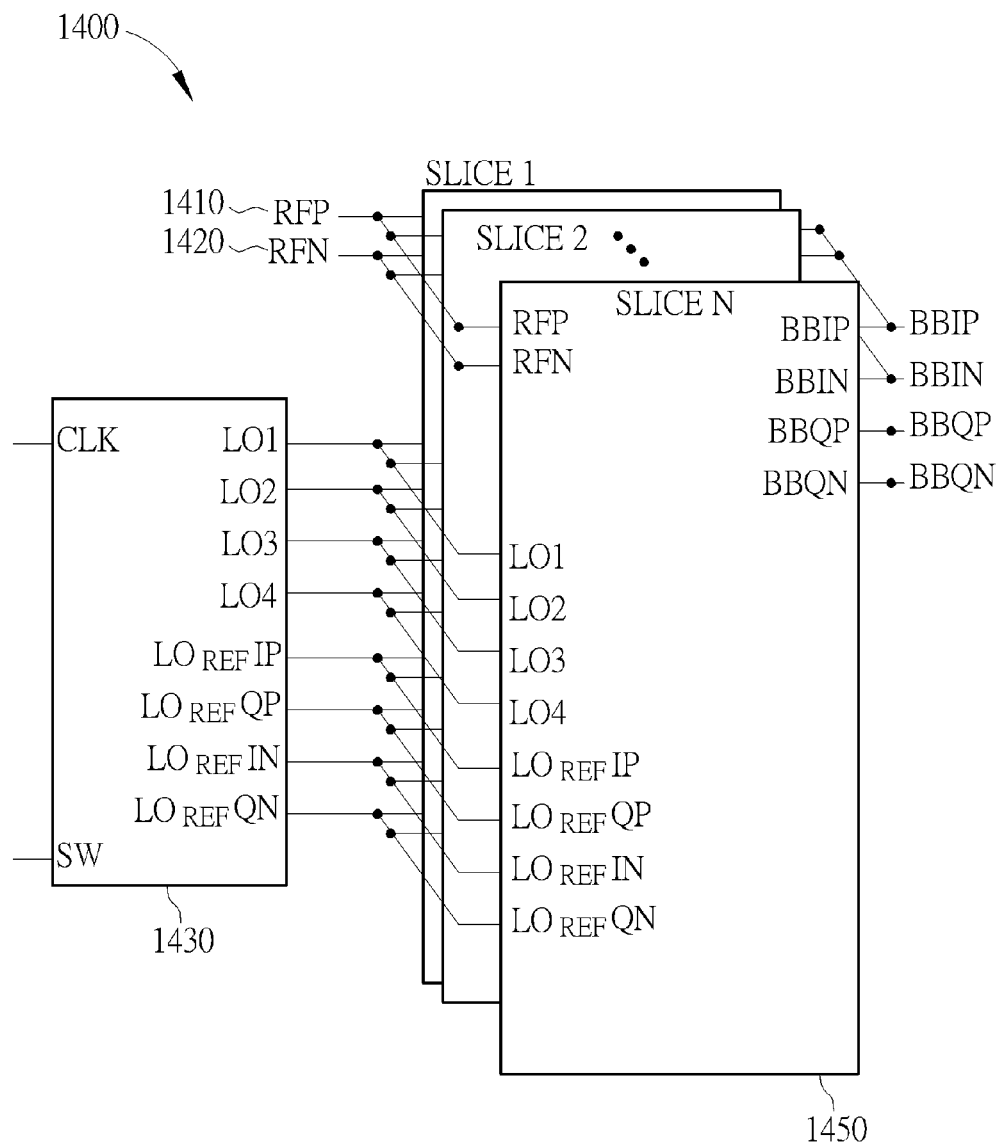
FIG. 14 illustrates a plurality of sliced local oscillator drivers/synchronisers for a receiver, according to aspects of the invention.

Referring to FIG. 14, a further example implementation of a receiver architecture 1400, utilising a frequency and phase conversion circuit with a programmable duty cycle is illustrated. In this example, the receiver architecture 1400 receives transmitted signals RFP 1410 and RFN 1420. The receiver architecture 1400 comprises a local oscillator block 1130 and a plurality of sliced receiver blocks 1150, each comprising local oscillator drivers/synchronisers, operable to drive a number of sliced mixers (not shown).

Figure 15:
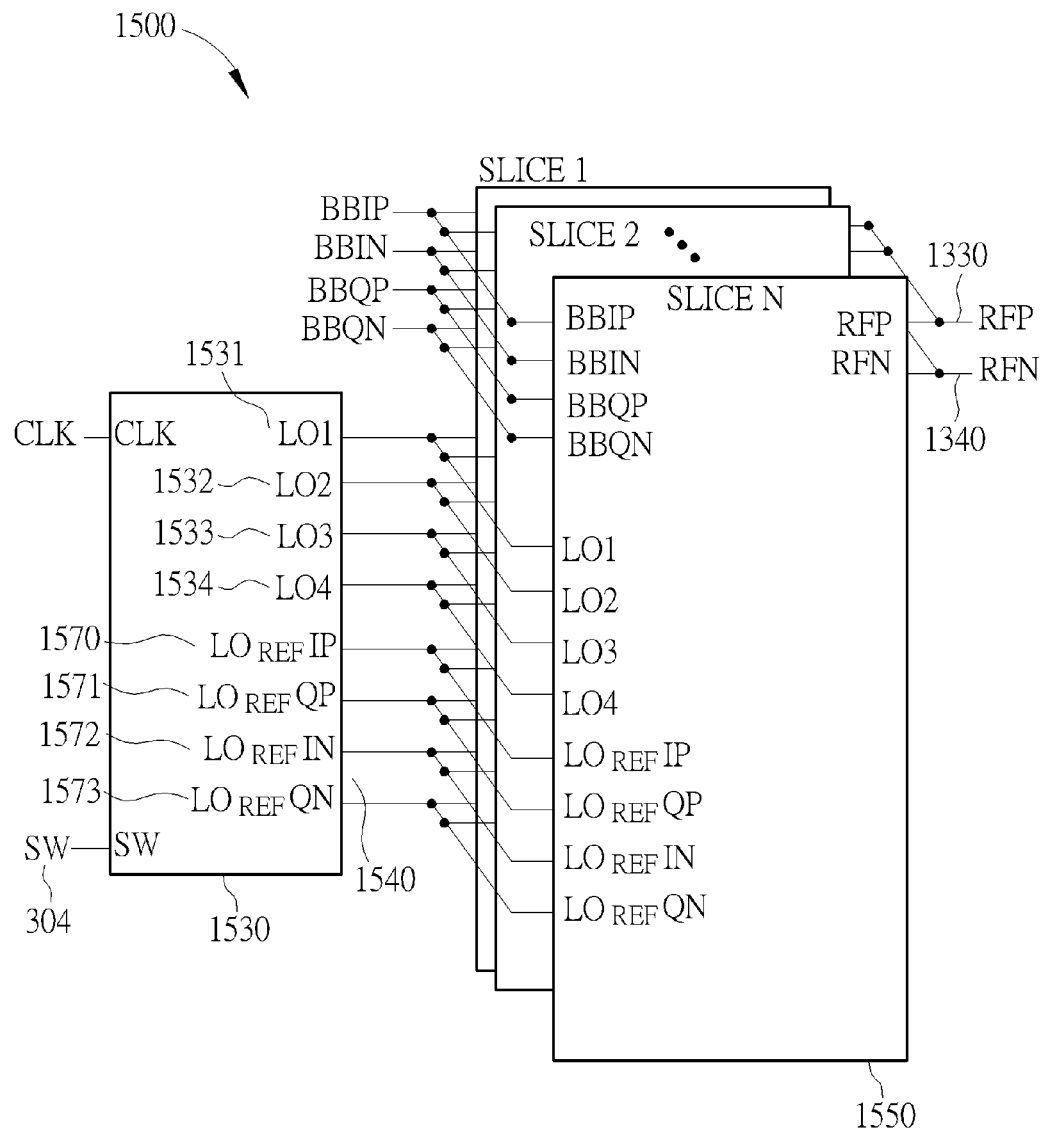
FIG. 15 illustrates a plurality of sliced local oscillator drivers/synchronisers for a transmitter, according to aspects of the invention.

Referring to FIG. 15, an example implementation of a transmitter device 1500 utilising a frequency and phase conversion circuit with a programmable duty cycle is illustrated. The transmitter device 1500 is arranged to use one or more of a number of respective transmitter slices 1550. In this illustrative example, each respective transmitter slice 1550 comprises a plurality of local oscillator input signals arranged to receive local oscillator signals 1540 from a separate local oscillator block 1530. Again, in some examples, switching input 304 may enable devices and/or signal paths and may be set by controller 214 of FIG. 2, to form a programmable duty cycle circuit.

In this illustrative example, each respective transmitter slice 1550 comprises one or more sliced local oscillator driver(s)/synchroniser(s), operable to drive a number of sliced mixers (not shown) on the transmitter slice 1550. In this illustrative example, each respective transmitter slice 1550 comprises two radio frequency outputs 1330, 1340 arranged to output respective RF signals to be combined. The N-phase duty-cycle waveforms are generated locally within a slice, and reduce relative phase errors. For 25% duty cycle, LO phases of 0°, 90°, 180° and 270° (i.e. a total of 4 phases) are needed. For 33% duty cycle, LO phases of 0° to 330° at a step of 30° (i.e. a total of 12 phases) are needed.

In this structure, the noise critical paths are the global routing (due to long traces) of the four clock waveforms ('LO1' 1531, 'LO3' 1533, 'LO2' 1532, 'LO4' 1534) associated with divide-by-four local oscillator reference signals embedded within the slice ('$LO_{REF}IP$' 1570, '$LO_{REF}QP$' 1571, '$LO_{REF}IN$' 1572, $LO_{REF}QN$' 1573). During a 33% duty cycle case, divide-by-four local oscillator reference signals 406 to 412 are different for each sub-slice. Thus, a total of 12 phases are required (0° to 330° at a step of 30°). Therefore, if a global routing scheme is enabled, in supporting a 33% duty cycle case, a total of 12 global routings are required instead of a maximum of four routings as in the described architecture, degrading mismatch and power consumption. Further, in some examples relating to a 33% duty cycle, the number of noise critical paths may reduce from twelve to four.

Figure 16:
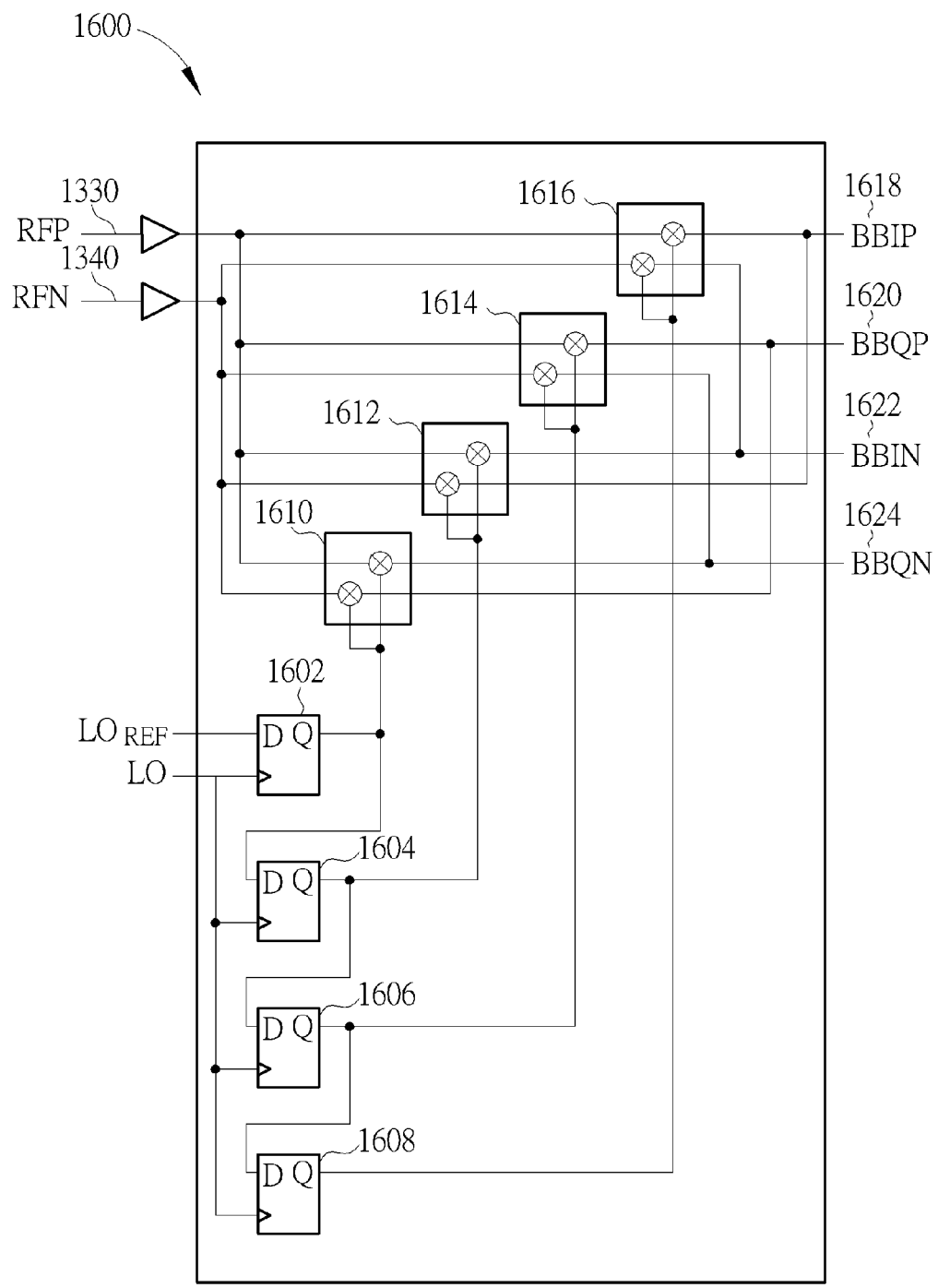
FIG. 16 illustrates a block diagram of a receive driver/synchroniser block, according to aspects of the invention.

Referring to FIG. 16, a block diagram of a receive driver/synchroniser block 1600, which may be comprised within the receiver architecture 1400 of FIG. 14, is illustrated. The receive driver/synchroniser block 1600 comprise a series of latches 1602, 1604, 1606 and 1608, which may collectively form a shift register device, and a series of mixer blocks 1610, 1612, 1614, 1616, operably coupled to receive signals RFP 1330 and RFN 1340.

In this example, the series of latches 1602, 1604, 1606 and 1608 provide phase shifted signals with either a 25% or 33% duty cycle to corresponding mixer blocks 1600, 1612, 1614 and 1616, wherein the mixer blocks multiply the phase shifted signals with received output signals RFP 1081, RFN 1082 to output baseband signals BBIP 1618, BBQP 1620, BBIN 1222 and BBQN 1624.

In particular, it is envisaged that the aforementioned inventive concept can be applied by a semiconductor manufacturer to any integrated circuit comprising a radio frequency and/or synchronous clock application. It is further envisaged that, for example, a semiconductor manufacturer may employ the inventive concept in a design of a stand-alone device, or application-specific integrated circuit (ASIC) and/or any other sub-system element.

Aspects of the invention may be implemented in any suitable form including hardware, software, firmware or any combination of these. The invention may optionally be implemented, at least partly, as computer software running on one or more data processors and/or digital signal processors or configurable module components such as FPGA devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor or controller. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved communication unit and sliced radio frequency module have been described, wherein the aforementioned disadvantages with prior art arrangements have been substantially alleviated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency and phase conversion circuit for supporting a plurality of different duty cycle clock signals comprising:
   a local oscillator module arranged to receive at least one input clock signal wherein a plurality of phases of the at least one input clock signal are selectable to support a plurality of different duty cycle clock signals; and
   a plurality of mixer arrangements configured to receive at least one baseband input signal and the selected plurality of phases of the at least one input clock signal and output a frequency and phase converted representation of the at least one baseband input signal;
   wherein at least one of the plurality of mixer arrangements is re-used in a plurality of the selectable supportable duty cycles.

2. The frequency and phase conversion circuit of claim 1 wherein the number of mixer arrangements enabled is less than a total number of the plurality of phases of duty cycle clock signals supported by the frequency and phase conversion circuit.

3. The frequency and phase conversion circuit of claim 2 wherein the number ('n') of mixer arrangements enabled to output a required number of phase shifted waveforms is inversely proportional (1/n) to a duty cycle currently being supported from a plurality of selectable supportable duty cycles.

4. The frequency and phase conversion circuit of claim 2 wherein the number ('n') of mixer arrangements enabled corresponds to a number ('n') of local oscillator phases that are enabled.

5. The frequency and phase conversion circuit of claim 1 wherein a minimum number of mixer arrangements enabled to output a required number of phase shifted waveforms is inversely proportional to a minimum duty cycle being supported by the frequency and phase conversion circuit.

6. The frequency and phase conversion circuit of claim 1 wherein the local oscillator module comprises a plurality of dividers arranged to receive and divide a plurality of input clock signals to support the plurality of selectable supportable duty cycles.

7. The frequency and phase conversion circuit of claim 6 wherein the local oscillator module comprises at least one multiplexer configured to receive a plurality of output signals provided by each of the plurality of dividers and output a selected set of clock signals dependent upon a selected duty cycle.

8. The frequency and phase conversion circuit of claim 7 wherein the local oscillator module comprises an input configured to receive a switchable control to select a duty cycle to be enabled from the plurality of the selectable supportable duty cycles.

9. The frequency and phase conversion circuit of claim 1 wherein the local oscillator module further comprises asynchronous logic in cooperation with at least one divide-by-2N circuit, where N is a positive integer except zero, to generate an even number duty cycle clock signal.

10. The frequency and phase conversion circuit of claim 1 further comprising an arrangement of latches connected in series configured to receive an output from a multiplexer as a clock signal for the series of latches.

11. The frequency and phase conversion circuit of claim 10 wherein a minimum number ('n') of latches enabled is inversely proportional (1/n) to a selected duty cycle.

12. The frequency and phase conversion circuit of claim 11 wherein the number of enabled latches in series comprise at least four latches configured to support a 25% duty cycle clock signal and at least three latches to support a 33% duty cycle clock signal.

13. The frequency and phase conversion circuit of claim 10 wherein the arrangement of latches connected in series comprises one from a group of: a series of D-type flip flops, a series of shift registers.

14. The frequency and phase conversion circuit of claim 1 wherein the plurality of mixer arrangements comprise mixers configured to receive a plurality of baseband differential input signals, such that each of the plurality of mixer arrangements comprise at least two differential mixer stages.

15. The frequency and phase conversion circuit of claim 1 wherein the plurality of mixer arrangements comprise mixers configured to receive a plurality of baseband input signals, such that each of the plurality of mixer arrangements comprise at least two mixer stages configured for use in quadrature rejection.

16. The frequency and phase conversion circuit of claim 1 comprising a plurality of sliced frequency conversion modules with combined outputs.

17. An integrated circuit for supporting a plurality of different duty cycles, the integrated circuit comprising a frequency and phase conversion circuit slice comprising a plurality of mixer arrangements configured to receive at least one baseband input signal and a selected plurality of phases of at least one input clock signal and output a frequency and phase converted representation of the at least one baseband input signal wherein at least one of the plurality of mixer arrangements is re-used in a plurality of the selectable supportable duty cycles.

18. A wireless communication unit for supporting a plurality of different duty cycle clock signals, the wireless communication unit comprising a frequency and phase conversion circuit, wherein the frequency and phase conversion circuit comprises:
  a local oscillator module arranged to receive at least one input clock signal wherein a plurality of phases of the at least one input clock signal are selectable to support a plurality of different duty cycle clock signals; and
  a plurality of mixer arrangements configured to receive at least one baseband input signal and the selected plurality of phases of the at least one input clock signal and output a frequency and phase converted representation of the at least one baseband input signal wherein at least one of the plurality of mixer arrangements is re-used in a plurality of the selectable supportable duty cycles.

19. The wireless communication unit of claim 18 wherein a minimum number of mixer arrangements enabled to output a required number of phase shifted waveforms is inversely proportional to a minimum duty cycle being supported by the frequency and phase conversion circuit.

20. A method for frequency and phase conversion to support a plurality of different duty cycle clock signals, the method comprising:
  receiving at least one input clock signal at a local oscillator generation circuit wherein a plurality of phases of the at least one input clock signal are selectable to support a plurality of different duty cycle clock signals;
  enabling a number of mixer arrangements;
  receiving at least one baseband input signal and a selected plurality of phases of the at least one input clock signal at a plurality of mixer arrangements; and
  outputting a frequency and phase converted representation of the at least one baseband input signal;
  wherein at least one of the plurality of mixer arrangements is re-used in a plurality of the selectable supportable duty cycles.

21. A frequency and phase conversion circuit for supporting a plurality of different duty cycles, comprising a plurality of mixer arrangements configured to receive at least one input signal and a selected plurality of phases of at least one input clock signal and output at least one baseband signal wherein at least one of the plurality of mixer arrangements is re-used in a plurality of the selectable supportable duty cycles.

22. A method for frequency and phase conversion to support a plurality of different duty cycle clock signals, the method comprising:
  receiving at least one input clock signal at a local oscillator generation circuit wherein a plurality of phases of the at least one input clock signal are selectable to support a plurality of different duty cycle clock signals;
  enabling a number of mixer arrangements;
  receiving at least one input signal and a selected plurality of phases of the at least one input clock signal at a plurality of mixer arrangements; and
  outputting at least one baseband signal;
  wherein at least one of the plurality of mixer arrangements is re-used in a plurality of the selectable supportable duty cycles.

* * * * *